US012628473B2

(12) United States Patent
Jin et al.

(10) Patent No.: US 12,628,473 B2
(45) Date of Patent: May 12, 2026

(54) DISPLAY DEVICE AND METHOD OF FABRICATING DISPLAY DEVICE

(71) Applicant: Samsung Display Co., LTD., Yongin-si (KR)

(72) Inventors: Tae Ha Jin, Yongin-si (KR); Seul Ki Kim, Gwangmyeong-si (KR); Seon Beom Ji, Seoul (KR); Dong Hwan Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1030 days.

(21) Appl. No.: 17/550,528

(22) Filed: Dec. 14, 2021

(65) Prior Publication Data

US 2022/0328725 A1     Oct. 13, 2022

(30) Foreign Application Priority Data

Apr. 7, 2021     (KR) ........................ 10-2021-0044988

(51) Int. Cl.
    H10H 20/831        (2025.01)
    H10H 20/01         (2025.01)
            (Continued)

(52) U.S. Cl.
    CPC ........ H10H 20/8312 (2025.01); H10H 20/01 (2025.01); H10H 20/857 (2025.01);
            (Continued)

(58) Field of Classification Search
    CPC .. H10H 20/8312; H10H 20/01; H10H 20/857; H10H 29/142; H10H 20/032;
            (Continued)

(56) References Cited

U.S. PATENT DOCUMENTS 12,166,157 B2     12/2024  Moon et al.
2021/0217739 A1     7/2021  Lee et al.
                  (Continued)

FOREIGN PATENT DOCUMENTS

KR     10-2020-0004936        1/2020
KR     10-2020-0027136        3/2020
                  (Continued)

*Primary Examiner* — Fernando L Toledo
*Assistant Examiner* — Alex Konic
(74) *Attorney, Agent, or Firm* — Womble Bond Dickinson (US) LLP

(57)                 ABSTRACT

A display device includes a first electrode extending in a first direction on a substrate, a second electrode disposed parallel to the first electrode on the substrate, a third electrode separated from the first electrode by an electrode separation part on the substrate, a first insulating layer on the first to third electrodes and being patterned to correspond to the electrode separation part, a first light-emitting element between the first and second electrodes on the first insulating layer, a second insulating layer on a part of the first light-emitting element and the first insulating layer and being patterned to correspond to the electrode separation part, an electrode insulating portion overlapping an end of each of the first and third electrodes facing each other separated by the electrode separation part, and a third insulating layer overlapping the second insulating layer and the electrode insulating portion.

12 Claims, 14 Drawing Sheets

(51) Int. Cl.
    *H10H 20/857*     (2025.01)
    *H10H 29/14*     (2025.01)

(52) U.S. Cl.
    CPC ......... *H10H 29/142* (2025.01); *H10H 20/032*
              (2025.01); *H10H 20/0364* (2025.01)

(58) Field of Classification Search
    CPC .............. H10H 20/0364; H10D 8/043; H10D
              30/0295; H10D 84/8316; H10D 84/858;
              H10D 10/821; H10D 64/511; A01N
              1/146; H01L 25/0753; A23B 11/86
    See application file for complete search history.

(56)                   References Cited

U.S. PATENT DOCUMENTS

2021/0327954 A1*  10/2021  Cho ..................... H10H 29/142
2023/0352492 A1*  11/2023  Long .................... H01L 25/167

FOREIGN PATENT DOCUMENTS

KR     10-2020-0121956     10/2020
WO    WO-2020009274 A1 *  1/2020  ........... H01L 27/156

* cited by examiner

FIG. 1

GL: VGL, HGL

FIG. 8

RPAS    RMO

PAS2
PAS1
RME7

PAS3
PAS2
PAS1
RME5
VIA
PV
ILD
GI
BF

SUB

III    III'

FIG. 9

BNK1b ⎫
      ⎬ BNK1
BNK1a ⎭

RM1
CTA

CNT1 —

CNT2

BNK1b ⟩BNK1
BNK1a

ED1 —

ED4

BNK2 —

LEA —

RMO —

DISPLAY DEVICE AND METHOD OF FABRICATING DISPLAY DEVICE

CROSS-REFERENCE TO RELATED APPLICATION(S)

This application claims priority to and benefits of Korean Patent Application No. 10-2021-0044988 under 35 U.S.C. § 119, filed on Apr. 7, 2021 in the Korean Intellectual Property Office, the entire contents of which are incorporated herein by reference.

BACKGROUND

1. Technical Field

The disclosure relates to a display device and a method of fabricating the same.

2. Description of the Related Art

As information-oriented society evolves, various demands for display devices are ever increasing. For example, display devices are being employed by a variety of electronic devices such as smart phones, digital cameras, laptop computers, navigation devices, and smart televisions. Display devices may be flat panel display devices such as a liquid-crystal display device, a field emission display device, or an organic light-emitting display device. Among such flat panel display devices, a light-emitting display device may include a light-emitting element that can emit light on its own, so that each of the pixels of the display panel can emit light by themselves. Accordingly, a light-emitting display device can display images without a backlight unit that supplies light to the display panel. A light-emitting element may be an organic light-emitting diode using an organic material as a fluorescent material or an inorganic light-emitting diode using an inorganic material as a fluorescent material.

SUMMARY

Aspects of the disclosure provide a display device capable of improving the emission efficiency by preventing a parasitic current from flowing between electrodes, and a method of fabricating the same.

It should be noted that aspects of the disclosure are not limited to the above, and other aspects of the disclosure will be apparent to those skilled in the art from the following descriptions.

According to an embodiment of the disclosure, a display device may include a first electrode extending in a first direction on a substrate, a second electrode disposed parallel to the first electrode on the substrate, a third electrode separated from the first electrode by an electrode separation part on the substrate, a first insulating layer on the first electrode, the second electrode, and the third electrode, the first insulating layer being patterned to correspond to the electrode separation part, a first light-emitting element between the first electrode and the second electrode on the first insulating layer, a second insulating layer on a part of the first light-emitting element and the first insulating layer, the second insulating layer being patterned to correspond to the electrode separation part, an electrode insulating portion overlapping an end of each of the first electrode and the third electrode facing each other separated by the electrode separation part, and a third insulating layer overlapping the second insulating layer and the electrode insulating portion.

The electrode insulating portion may overlap ends of the first insulating layer patterned to correspond to the electrode separation part.

The electrode insulating portion may overlap ends of the second insulating layer patterned to correspond to the electrode separation part.

The electrode insulating portion may be spaced apart from the first light-emitting element.

The display may further comprise a thin-film transistor on the substrate, and a via layer that provides a flat surface over the thin-film transistor and supports the first electrode, the second electrode, and the third electrode. The electrode insulating portion may directly overlap an upper surface of the via layer exposed at the electrode separation part.

The display device may further comprise a first bank protruding from the upper surface of the via layer to support the first electrode, the second electrode, and the third electrode. The electrode insulating portion may be spaced apart from the first bank.

The display device may further comprise a second bank disposed on the first insulating layer and spaced apart from and surrounding the first light-emitting element and the first bank. The electrode insulating portion may be spaced apart from the second bank.

The display device may further comprise a first contact electrode electrically connecting a first end of the first light-emitting element with the first electrode, and a second contact electrode electrically connecting a second end of the first light-emitting element with the second electrode. The first contact electrode and the second contact electrode may be insulated from the first electrode, the second electrode, and the third electrode by the electrode insulating portion.

The third insulating layer may overlap an end of the electrode insulating portion on the first electrode, and the third insulating layer may overlap another end of the electrode insulating portion on the second electrode.

The display device may further comprise a fourth electrode separated from the second electrode by the electrode separation part on the substrate. The electrode insulating portion may overlap an end of each of the second electrode and the fourth electrode facing each other at the electrode separation part.

The display device may further comprise a second light-emitting element between the third electrode and the fourth electrode on the first insulating layer, and a third contact electrode disposed in parallel with a part of the second contact electrode. The second contact electrode may extend from above the second electrode to above the third electrode to electrically connect a first end of the second light-emitting element with the third electrode. The third contact electrode may electrically connect a second end of the second light-emitting element with the fourth electrode.

The electrode insulating portion may be spaced apart from the second light-emitting element.

According to an embodiment of the disclosure, a method of fabricating a display device may comprise forming a first alignment electrode extending in a first direction on a substrate, forming a second alignment electrode parallel to the first alignment electrode on the substrate, forming a first insulating layer on the first alignment electrode and the second alignment electrode, aligning a light-emitting element between the first alignment electrode and the second alignment electrode, forming a second insulating layer on a part of the light-emitting element and the first insulating layer, patterning the first insulating layer and the second insulating layer, preparing a first electrode and a second electrode by cutting the first alignment electrode along an electrode separation part, and preparing a third electrode and a fourth electrode by cutting the second alignment electrode along the electrode separation part, forming an electrode insulating portion that overlaps ends of the first electrode and the second electrode facing each other and separated by the electrode separation part, and that overlaps ends of the third electrode and the fourth electrode facing each other and separated by the electrode separation part, and forming a third insulating layer on the second insulating layer and the electrode insulating portion.

The forming of the electrode insulating portion may comprise covering ends of the first insulating layer patterned to correspond to the electrode separation part.

The forming of the electrode insulating portion may comprise covering ends of the second insulating layer patterned to correspond to the electrode separation part.

The preparing of the first electrode, the second electrode, the third electrode, and the fourth electrode may comprise using a mask different from a mask used for patterning the first insulating layer and the second insulating layer.

The preparing of the first electrode, the second electrode, the third electrode, and the fourth electrode may comprise using a mask used for patterning the first insulating layer and the second insulating layer.

The forming of the electrode insulating portion may comprise forming the electrode insulating portion in a region spaced apart from the light-emitting element.

The method of fabricating a display device may further comprise forming a thin-film transistor on the substrate, and forming a via layer that provides a flat surface over the thin-film transistor and supports the first alignment electrode and the second alignment electrode. The forming of the electrode insulating portion may comprise forming the electrode insulating portion to directly overlap an upper surface of the via layer exposed at the electrode separation part.

The method of fabricating a display device may further comprise forming a first bank protruding from the upper surface of the via layer to support the first alignment electrode and the second alignment electrode. The forming of the electrode insulating portion may comprise forming the electrode insulating portion in a region spaced apart from the first bank.

According to an embodiment of the disclosure, a display device may include an electrode insulating portion covering an electrode separation part and a cut area, thereby preventing a parasitic current between electrodes. In this manner, the amount of emitted light per unit area of a pixel can be increased and the emission efficiency can be improved.

It should be noted that effects of the disclosure are not limited to those described above and other effects of the disclosure will be apparent to those skilled in the art from the following descriptions.

BRIEF DESCRIPTION OF THE DRAWINGS

The above and other aspects and features of the disclosure will become more apparent by describing in detail embodiments thereof with reference to the attached drawings, in which:

FIG. 1 is a schematic plan view showing a display device according to an embodiment of the disclosure.

FIG. 8 is a schematic cross-sectional view, taken along line III-III' of FIG. 5.

FIGS. 9 to 14 are schematic plan views showing processing steps of fabricating a display device according to an embodiment of the disclosure.

DETAILED DESCRIPTION OF THE EMBODIMENTS

Figure 2:
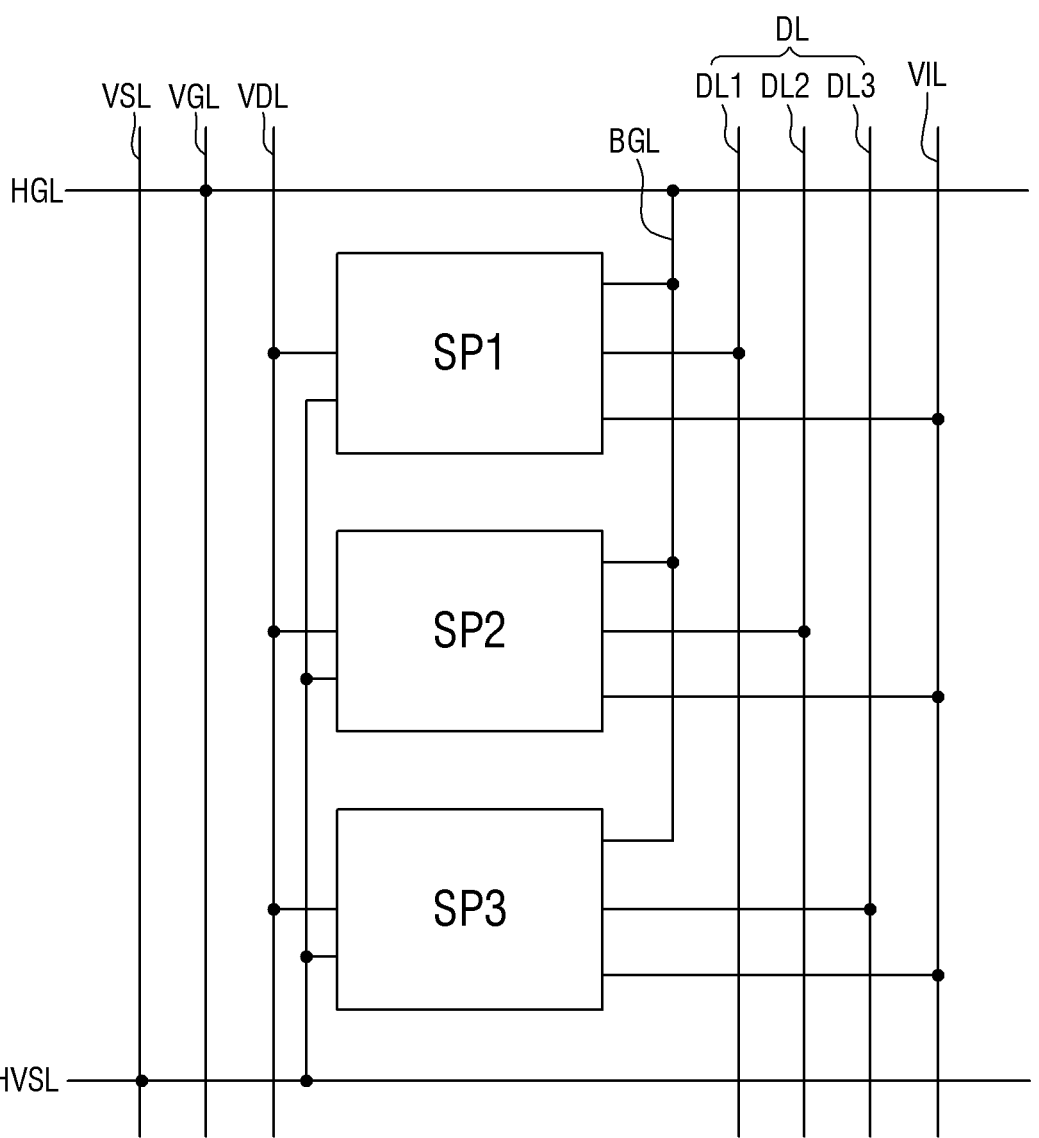
FIG. 2 is a schematic view showing pixels and lines in a display device according to an embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods employing one or more of the aspects of the disclosure. It is apparent, however, that various embodiments may be practiced without these specific details or with one or more equivalent arrangements. In other instances, well-known structures and devices may be shown in block diagram form in order to avoid unnecessarily obscuring various embodiments. Further, various embodiments may be different, but do not have to be exclusive. For example, specific shapes, configurations, and characteristics of an embodiment may be used or implemented in other embodiments without departing from the spirit and scope of this disclosure.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the spirit and scope of this disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there may be no intervening elements or layers present. The term "connected" may refer to physical, electrical, and/or fluid connection, with or without intervening elements. When an element is referred to as being "in contact" or "contacted" or the like with respect to another element, the element may be in "electrical contact", in "physical contact", and/or in "fluid contact" with another element.

Further, the X-axis, the Y-axis, and the Z-axis may not be limited to three axes of a rectangular coordinate system (e.g., the X-, Y-, and Z-axes), and the same may be interpreted in a broader sense. For example, the X-axis, the Y-axis, and the Z-axis may be perpendicular to one another, or may represent different directions that may not be perpendicular to one another.

For the purposes of this disclosure, "at least one of X, Y, and Z" and "at least one selected from the group of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or."

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well (and vice versa), unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are inclusive of the stated value and mean within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and are not necessarily intended to be limiting.

As customary in the field, some embodiments may be described and illustrated in the accompanying drawings in terms of functional blocks, units, parts, and/or modules. Those skilled in the art will appreciate that these blocks, units, parts, and/or modules may be physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

Unless otherwise defined or implied herein, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or overly formal sense, unless clearly so defined herein.

Figure 1:
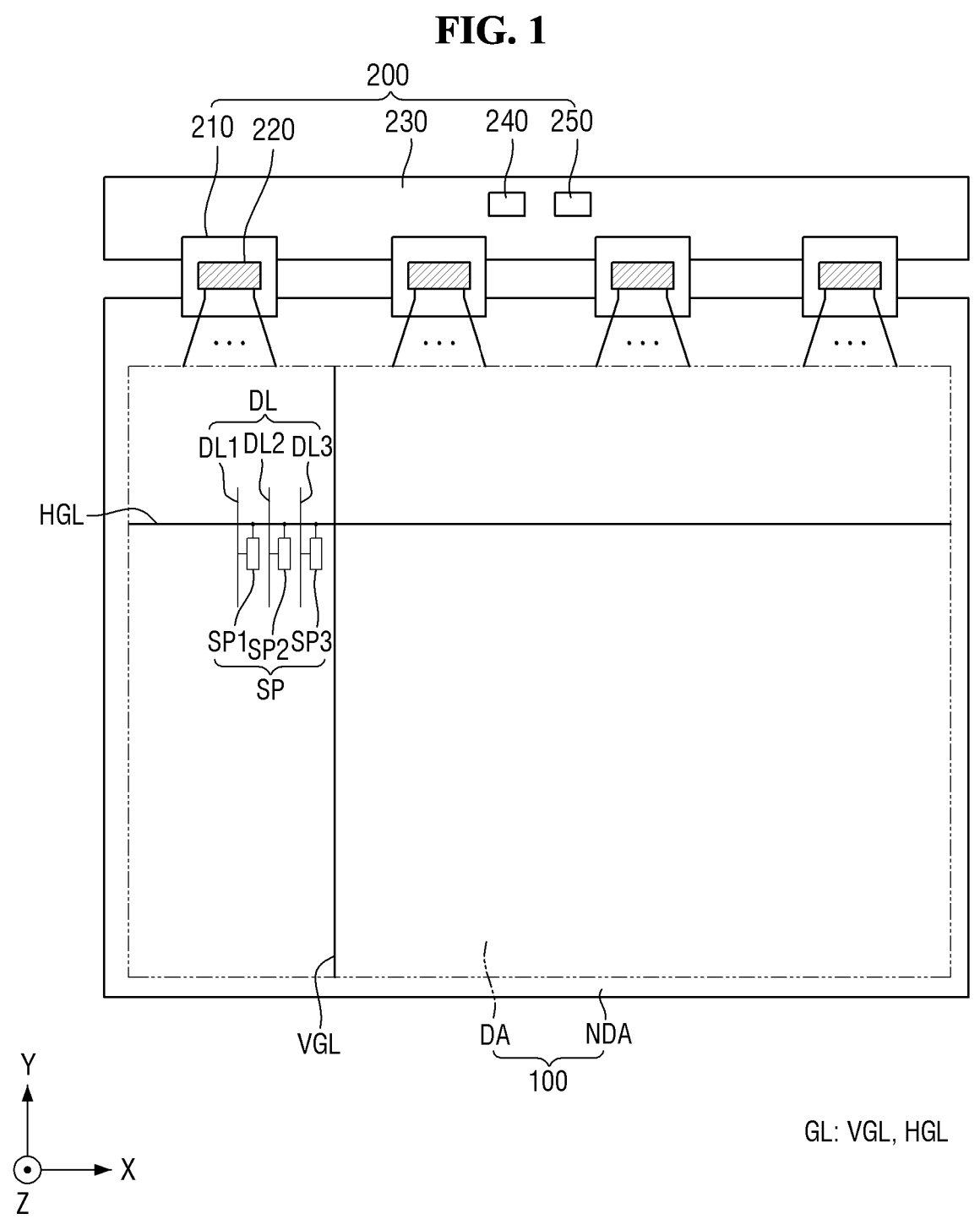

FIG. 1 is a schematic plan view showing a display device according to an embodiment of the disclosure.

As used herein, the terms "above," "top" and "upper surface" may refer to the upper side of the display device, i.e., the side indicated by the arrow in the z-axis direction, whereas the terms "below," "bottom" and "lower surface" may refer to the lower side of the display device, i.e., the opposite side in the z-axis direction. As used herein, the terms "left," "right," "upper" and "lower" sides may indicate relative positions when the display device is viewed from the top. For example, the "left side" may refer to the opposite side of the arrow of the x-axis direction, the "right side" may refer to the side indicated by the arrow of the x-axis direction, the "upper side" may refer to the side indicated by the arrow of the y-axis direction, and the "lower side" may refer to the opposite side of the arrow of the y-axis direction.

Referring to FIG. 1, the display device may be for displaying video or still images. The display device may be used as the display screen of portable electronic devices such as a mobile phone, a smart phone, a tablet PC, a smart watch, a watch phone, a mobile communications terminal, an electronic notebook, an electronic book, a portable multimedia player (PMP), a navigation device and an ultra mobile PC (UMPC), as well as the display screen of various products such as a television, a laptop computer, a monitor, a billboard and Internet of Things devices.

The display device may include a display panel 100 and a display driver 200.

The display panel 100 may have a rectangular shape when viewed from the top. For example, the display panel 100 may have a rectangular shape having longer sides in the first direction (x-axis direction) and shorter sides in the second direction (y-axis direction) when viewed from the top. The corners where the shorter sides in the first direction (x-axis direction) meet the longer sides in the second direction (y-axis direction) may be a right angle or may be rounded with a curvature. The shape of the display panel 100 when viewed from the top is not limited to a rectangular shape, but may be formed in a different polygonal shape, a circular shape, or an elliptical shape. For example, the display panel 100 may be formed flat, but the disclosure is not limited thereto. For another example, the display panel 100 may be formed to bend with a curvature.

The display panel 100 may include a display area DA and a non-display area NDA.

The display area DA may display images and may be defined as a central area of the display panel 100. The display area DA may include pixels SP, each which may be an intersection of data lines DL and gate lines GL. The gate lines GL may include vertical gate lines VGL and horizontal gate lines HGL. For example, the vertical gate lines VGL may be connected to a data driver 220 and may be extended in the second direction (y-axis direction). Each of the horizontal gate lines HGL may be connected to a the vertical gate line VGL and may be extended in the first direction (x-axis direction). Each of the pixels SP may include first to third sub-pixels SP1, SP2 and SP3. Each of the first to third sub-pixels SP1, SP2 and SP3 may be connected to at least one horizontal gate line HGL and at least one data line DL. Each of the first to third sub-pixels SP1, SP2 and SP3 may be defined as a minimum unit area that emits light.

The data lines DL may be extended in the second direction (y-axis direction) and may be spaced apart from each other in the first direction (x-axis direction). The data lines DL may include first to third data lines DL1, DL2 and DL3. The first to third data lines DL1, DL2 and DL3 may supply data voltages to the first to third sub-pixels SP1, SP2 and SP3, respectively.

The vertical gate lines VGL may be extended in the second direction (y-axis direction) and may be spaced apart from one another in the first direction (x-axis direction). The vertical gate lines VGL may be arranged in parallel with the data lines DL. The horizontal gate lines HGL may be extended in the first direction (x-axis direction) and may be spaced apart from one another in the second direction (x-axis direction). The horizontal gate lines HGL may intersect the vertical gate lines VGL.

The connection relationship between the data lines DL, the vertical gate lines VGL, the horizontal gate lines HGL and the pixels SP is not limited to the connection relationship shown in FIG. 1. The connection relationship between the data lines DL, the vertical gate lines VGL, the horizontal gate lines HGL and the pixels SP may vary depending on the number and the arrangement of the pixels SP.

The non-display area NDA may be defined as the remaining area of the display panel 100 except the display area DA. For example, the non-display area NDA may include fan-out lines connecting the data lines DL or the vertical gate lines VGL with the data driver 220, and a pad area (not shown) connected to a flexible film 210.

The display driver 200 may be connected to the pad area provided in the non-display area NDA of the display panel 100 to drive the pixels SP to display images based on image data supplied from a display driving system. The display driver 200 may include a flexible film 210, a data driver 220, a circuit board 230, a timing controller 240 and a power supply 250.

The input terminals disposed on a side of the flexible film 210 may be attached to the circuit board 230 via a film attaching process, and the output terminals provided on another side of the flexible film 210 may be attached to the pad area via the film attaching process. For example, the flexible film 210 may be a flexible film that can be bent, such as a tape carrier package and a chip on film. The flexible film 210 may be bent so that it may be disposed under the display panel 100 to reduce the bezel area of the display device.

The data driver 220 may be mounted on the flexible film 210. For example, the data driver 220 may be implemented as an integrated circuit (IC). The data driver 220 may receive digital video data and a data control signal from the timing controller 240, and may convert the digital video data into an analog data voltage in response to the data control signal to send it to the data lines DL through the fan-out lines. The data driver 220 may generate a gate signal in response to a gate control signal supplied from the timing controller 240 and sequentially supply the gate signal to the vertical gate lines VGL in an order.

The circuit board 230 may support the timing controller 240 and the power supply 250, and may transmit signals and voltages between the elements of the display driver 200. For example, the circuit board 230 may supply a signal supplied from the timing controller 240 and driving power supplied from the power supply 250 to the data driver 220 to drive the pixels to display images. To this end, a signal transmission line and power lines may be disposed on the circuit board 230.

The timing controller 240 may be mounted on the circuit board 230 and may receive image data and a timing synchronization signal supplied from the display driving system through a user connector provided on the circuit board 230. The timing controller 240 may generate digital video data by coordinating the image data appropriately for the pixel arrangement structure in response to a timing synchronization signal, and may supply the generated digital video data to the data driver 220. The timing controller 240 may generate a data control signal and a gate control signal based on the timing synchronization signal. The timing controller 240 may control the supply timing of the data voltage of the data driver 220 based on the data control signal, and may control the supply timing of the gate signal of the data driver 220 based on the gate control signal.

The power supply 250 may be disposed on the circuit board 230 to apply a supply voltage to the data driver 220 and the display panel 100. For example, the power supply 250 may generate a first driving voltage and supply it to the driving voltage line, may generate a second driving voltage and supply it to a low-level voltage line, and may generate an initialization voltage and supply it to an initialization voltage line. The first driving voltage may be a high-level voltage that drives the pixels SP, the second driving voltage may be a low-level voltage commonly supplied to the pixels SP, and the initialization voltage may initialize certain nodes of the pixels SP.

FIG. 2 is a schematic view showing pixels and lines in a display device according to an embodiment.

Referring to FIG. 2, the pixels SP may include first to third pixels SP1, SP2 and SP3. The pixel circuit of the first sub-pixel SP1, the pixel circuit of the second sub-pixel SP2 and the pixel circuit of the third sub-pixel SP3 may be arranged in the direction opposite to the second direction (y-axis direction). It should be understood that the order of the pixel circuits is not limited thereto.

A first voltage line VDL may be extended in the second direction (y-axis direction). The first voltage line VDL may be disposed on a side (e.g., the left side) of the pixel circuits of the first to third sub-pixels SP1, SP2 and SP3. The first voltage line VDL may be a driving voltage line that supplies a driving voltage or a high-level voltage to the sub-pixels SP. The first voltage line VDL may supply a driving voltage to each of the first to third sub-pixels SP1, SP2 and SP3.

The gate line GL may include a vertical gate line VGL, a horizontal gate line HGL, and an auxiliary gate line BGL.

The vertical gate line VGL may be extended in the second direction (y-axis direction). The vertical gate line VGL may be disposed on a side (e.g., the left side) of the first voltage line VDL. The vertical gate line VGL may be connected between the data driver 220 and the horizontal gate line HGL. The vertical gate lines VGL may intersect the horizontal gate lines HGL. Each of the vertical gate lines VGL may be insulated from horizontal gate lines other than the respective horizontal gate line HGL. The vertical gate line VGL may supply the gate signal received from the data driver 220 to the horizontal gate line HGL.

The horizontal gate line HGL may be extended in the first direction (x-axis direction). The horizontal gate line HGL may be disposed on the upper side of the pixel circuit of the first sub-pixel SP1. The horizontal gate line HGL may be connected between the vertical gate line VGL and the auxiliary gate line BGL. The horizontal gate line HGL may supply a gate signal received from the vertical gate line VGL to the auxiliary gate line BGL.

A second voltage line VSL may be extended in the second direction (y-axis direction). The second voltage line VSL may be disposed on a side (e.g., the left side) of the vertical gate line VGL. The second voltage line VSL may be connected between the power supply 250 and the horizontal voltage line HVSL. The second voltage line VSL may be a low-level voltage line that supplies a low-level voltage to each of the pixels SP. The second voltage line VSL may supply the low-level voltage supplied from the power supply 250 to the horizontal voltage line HVSL.

The horizontal voltage line HVSL may be extended in the first direction (x-axis direction). The horizontal voltage line HVSL may be disposed on the lower side of the pixel circuit of the third sub-pixel SP3. The horizontal voltage line HVSL may supply the low-level voltage received from the second voltage line VSL to the first to third sub-pixels SP1, SP2 and SP3.

The auxiliary gate line BGL may be extended in the direction opposite to the second direction (y-axis direction) from the horizontal gate line HGL. The auxiliary gate line BGL may be disposed on an opposite side (e.g., the right side) of the pixel circuits of the first to third sub-pixels SP1, SP2 and SP3. The auxiliary gate line BGL may supply the gate signal received from the horizontal gate line HGL to the pixel circuits of the first to third sub-pixels SP1, SP2 and SP3.

The data lines DL may be extended in the second direction (y-axis direction). The data lines DL may supply data voltage to each of the pixels SP. The data lines DL may include first to third data lines DL1, DL2 and DL3.

The first data line DL1 may be extended in the second direction (y-axis direction). The first data line DL1 may be disposed on another side (e.g., the right side) of the auxiliary gate line BGL. The first data line DL1 may supply the data voltage received from the data driver 220 to the pixel circuit of the first sub-pixel SP1.

The second data line DL2 may be extended in the second direction (y-axis direction). The second data line DL2 may be disposed on the opposite side (e.g., the right side) of the first data line DL1. The second data line DL2 may supply the data voltage received from the data driver 220 to the pixel circuit of the second sub-pixel SP2.

The third data line DL3 may be extended in the second direction (y-axis direction). The third data line DL3 may be disposed on the opposite side (e.g., the right side) of the second data line DL2. The third data line DL3 may supply the data voltage received from the data driver 220 to the pixel circuit of the third sub-pixel SP3.

An initialization voltage line VIL may be extended in the second direction (y-axis direction). The initialization voltage line VIL may be disposed on another side (e.g., the right side) of the third data line DL3. The initialization voltage line VIL may supply the initialization voltage received from the power supply 250 to the pixel circuit of each of the first to third sub-pixels SP1, SP2 and SP3.

Figure 3:
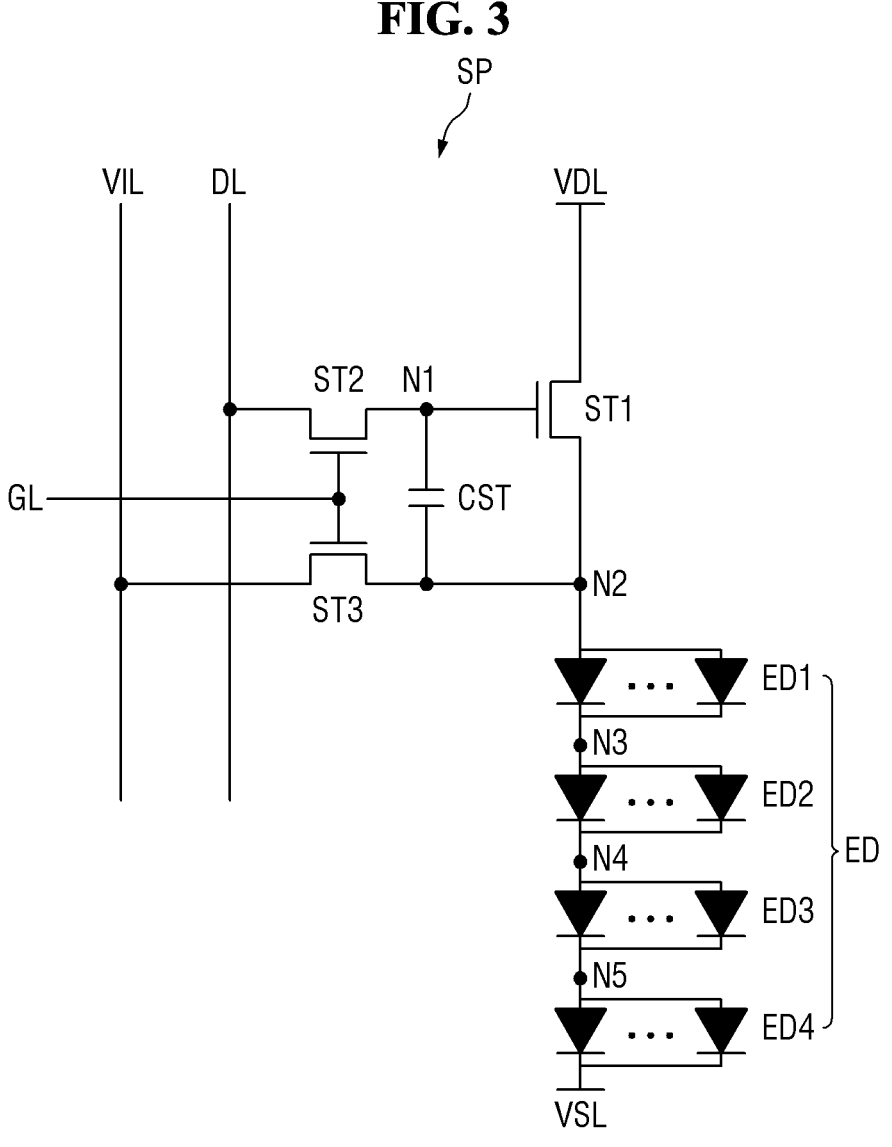
FIG. 3 is a schematic circuit diagram showing a pixel of a display device according to an embodiment of the disclosure.

FIG. 3 is a schematic circuit diagram showing a pixel of a display device according to an embodiment of the disclosure.

Referring to FIG. 3, each of the pixels SP may be connected to a gate line GL, a data line DL, a first voltage line VDL, a second voltage line VSL, and an initialization voltage line VIL.

Each of the pixels SP may include switching elements, a storage capacitor CST, and light-emitting diodes ED. The switching elements may include first to third transistors ST1, ST2 and ST3.

The first transistor ST1 may include a gate electrode, a drain electrode, and a source electrode. The gate electrode of the first transistor ST1 may be connected to a first node N1, the drain electrode thereof may be connected to the first voltage line VDL, and the source electrode thereof may be connected to a second node N2. The first transistor ST1 may control a source-drain current (or a driving current) according to a data voltage applied to the gate electrode.

The light-emitting diodes ED may include first to fourth light-emitting diodes ED1, ED2, ED3 and ED4. The first light-emitting diodes ED1 may be connected in parallel between the second node N2 and the third node N3. The second light-emitting diodes ED2 may be connected in parallel between the third node N3 and the fourth node N4. The third light-emitting diodes ED3 may be connected in parallel between the fourth node N4 and the fifth node N5. The fourth light-emitting diodes ED4 may be connected in parallel between the fifth node N5 and the second voltage line VSL. Accordingly, the first to fourth light-emitting diodes ED1, ED2, ED3 and ED4 may be connected in series. The first to fourth light-emitting diodes ED1, ED2, ED3 and ED4 may receive the driving current to emit light. The amount or the brightness of the light emitted from the light-emitting diodes ED may be proportional to the magnitude of the driving current. Each of the light-emitting diodes ED may be an inorganic light-emitting element including a first electrode, a second electrode, and an inorganic semiconductor disposed between the first electrode and the second electrode.

The second transistor ST2 may be turned on by a gate signal from the gate line GL to connect the data line DL with the first node N1, which may be the gate electrode of the first transistor ST1. The second transistor ST2 may be turned on in response to the gate signal to apply data voltage to the first node N1. The gate electrode of the second transistor ST2 may be connected to the gate line GL, the drain electrode may be connected to the data line DL, and the source electrode may be connected to the first node N1. The source electrode of the second transistor ST2 may be connected to the gate electrode of the first transistor ST1 and the first capacitor electrode of the storage capacitor CST through the first node N1.

The third transistor ST3 may be turned on by a gate signal of a gate line GL to connect the initialization voltage line VIL with the second node N2, which may be the source electrode of the first transistor ST1. The third transistor ST3 may be turned on in response to the gate signal to apply the initialization voltage to the second node N2. The gate electrode of the third transistor ST3 may be connected to the gate line GL, the drain electrode may be connected to the initialization voltage line VIL, and the source electrode may be connected to the second node N2. The source electrode of the third transistor ST3 may be connected to the source electrode of the first transistor ST1 through the second node N2, the second capacitor electrode of the storage capacitor CST, and the first electrodes of the first light-emitting diodes ED1.

Figure 4:
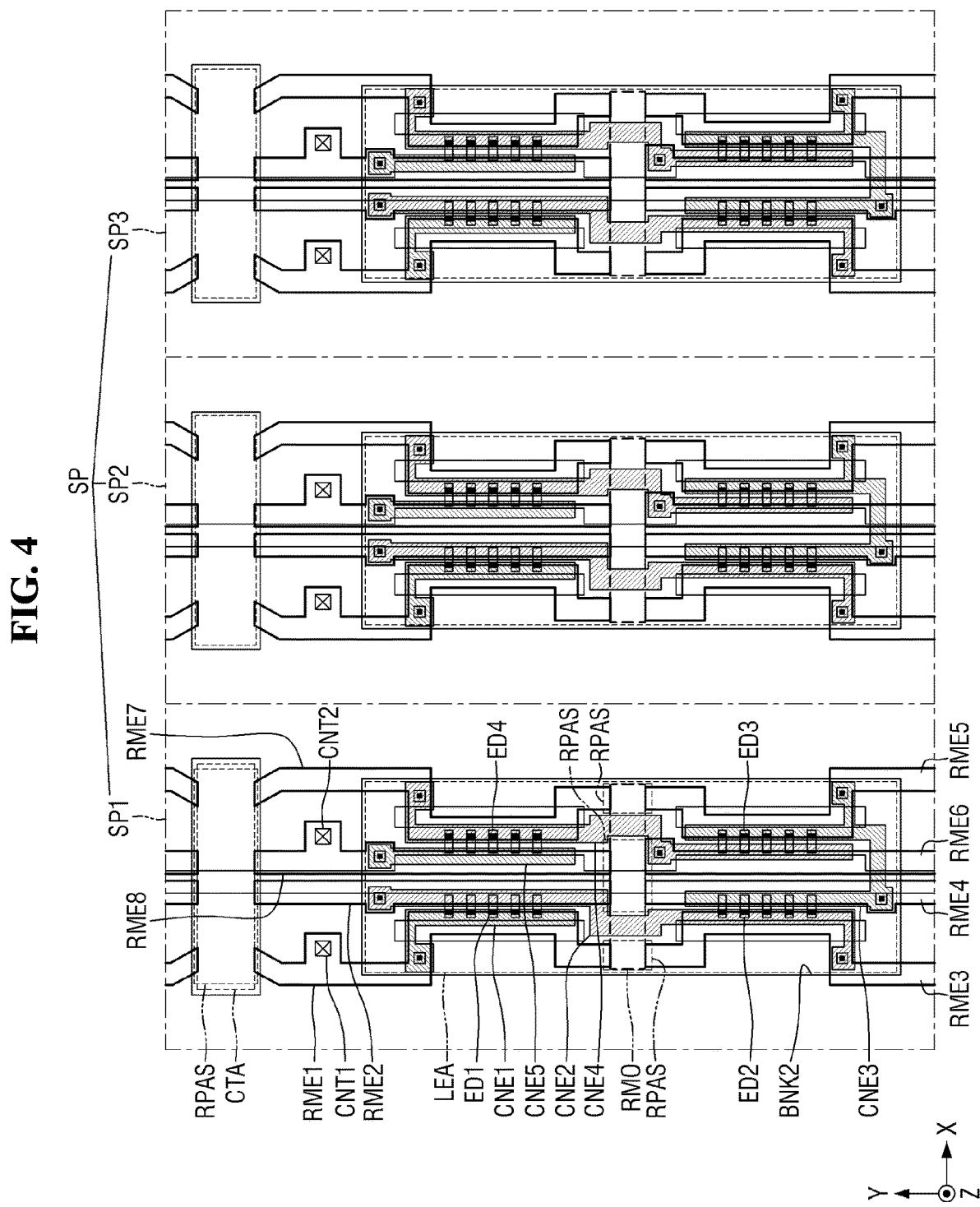
FIG. 4 is a schematic plan view showing a pixel in a display device according to an embodiment.
Figure 5:
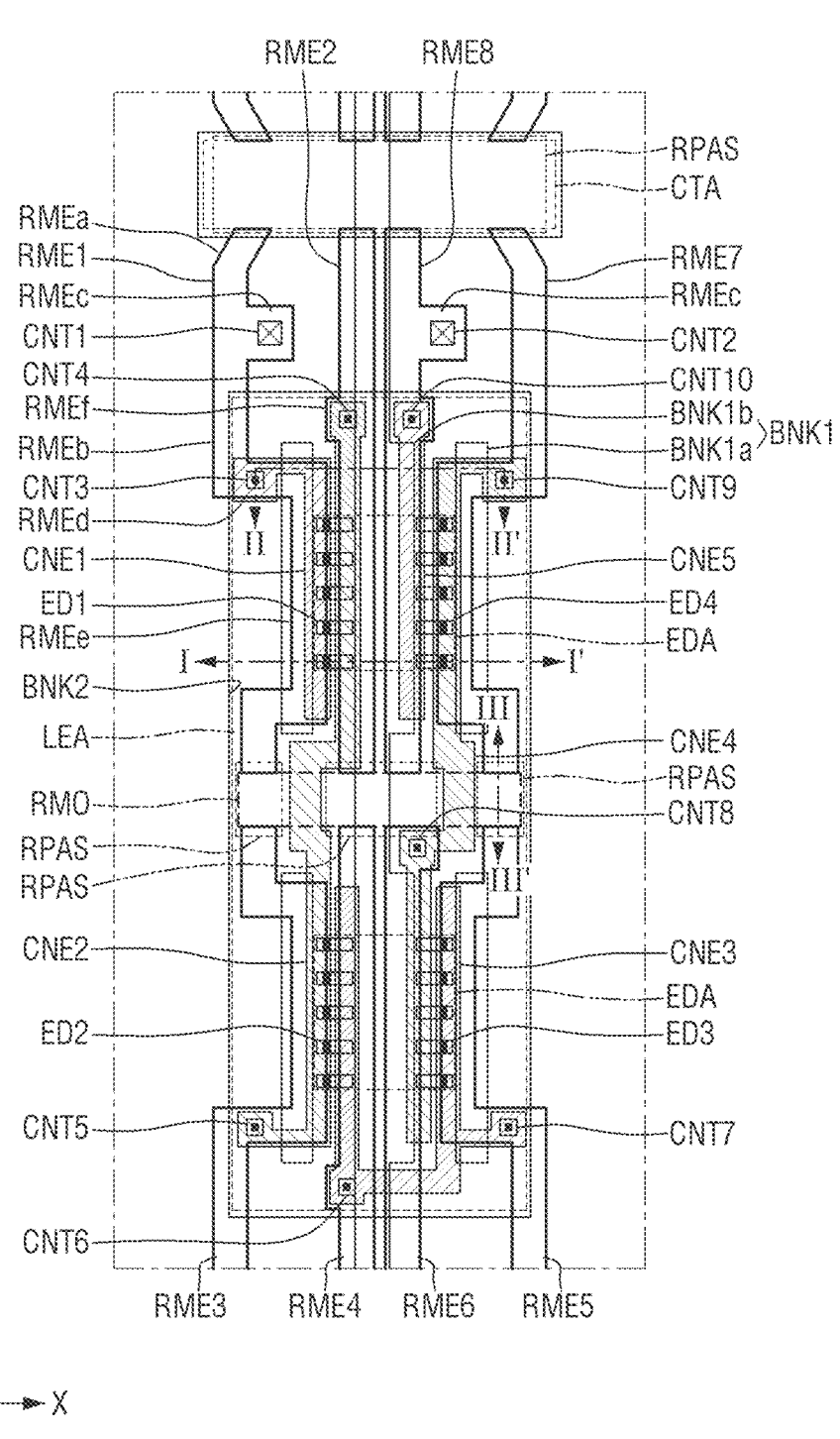
FIG. 5 is a schematic plan view showing a first sub-pixel in the display device according to an embodiment.

FIG. 4 is a schematic plan view showing a pixel in a display device according to an embodiment. FIG. 5 is a schematic plan view showing a first sub-pixel in the display device according to an embodiment.

Referring to FIGS. 4 and 5, the pixel SP may include first to third sub-pixels SP1, SP2 and SP3. Each of the first to third sub-pixels SP1, SP2 and SP3 may include a first bank BNK1, first to eighth electrodes RME1, RME2, RME3, RME4, RME5, RME6, RME7 and RME8, first to fourth light-emitting diodes ED1, ED2, ED3 and ED4, a second bank BNK2, an electrode insulating portion RPAS, and first to fifth contact electrodes CNE1, CNE2, CNE3, CNE4 and CNE5.

The first bank BNK1 may include first sub-banks BNK1a and a second sub-bank BNK1b. The first sub-banks BNK1a may be extended in the second direction (y-axis direction) on the sides of the second sub-bank BNK1b, respectively. The first sub-banks BNK1a may be spaced apart from one another in the first direction (x-axis direction) and the second direction (y-axis direction). The first sub-banks BNK1a may be disposed in the four areas, respectively, divided by lines intersecting the center of the light-emitting area LEA in the first direction (x-axis direction) and the second direction (y-axis direction). The first sub-banks BNK1a may be disposed in the light-emitting area LEA. The first sub-banks BNK1a may not overlap the second sub-bank BNK2 in the thickness direction and may not intersect the boundary with another adjacent sub-pixel.

The second sub-bank BNK1b may pass through the central portion of the light-emitting area LEA and may be extended in the second direction (y-axis direction). The second sub-bank BNK1b may be extended beyond the light-emitting area LEA. For example, the second sub-bank BNK1b may be disposed in the cut area CTA and may intersect the boundary with another adjacent sub-pixel in the second direction (y-axis direction). For another example, the second sub-bank BNK1b may not be disposed in the cut area CTA but may be disposed in the respective sub-pixel.

The second sub-bank BNK1b may be disposed between the first sub-banks BNK1a spaced apart from each other in the first direction (x-axis direction). Parts of the second sub-bank BNK1b disposed between the first sub-banks BNK1a may be wider. The second electrode RME2, the fourth electrode RME4, the sixth electrode RME6 and the eighth electrode RME8 may be disposed on the wider parts of the second sub-bank BNK1b. The first sub-banks BNK1a and the second sub-bank BNK1b may face each other, and the light-emitting diodes ED may be disposed between the first sub-banks BNK1a and the second sub-bank BNK1b.

A first electrode RME1 may be disposed on the upper left side with respect to the center of the light-emitting area LEA. The first electrode RME1 may include first to fifth portions RMEa, RMEb, RMEc, RMEd, and RMEe. The first portion RMEa of the first electrode RME1 may be extended in a diagonal direction between the first direction (x-axis direction) and the second direction (y-axis direction). The upper end of the first portion RMEa of the first electrode RME1 may be cut and accordingly insulated from the electrode of another adjacent sub-pixel. The second portion RMEb of the first electrode RME1 may be bent from the lower end of the first portion RMEa to be extended in the direction opposite to the second direction (y-axis direction). The third portion RMEc of the first electrode RME1 may protrude from the second portion RMEb in the first direction (x-axis direction). The third portion RMEc of the first electrode RME1 may be connected to the pixel circuit of the first sub-pixel SP1 through a first contact hole CNT1. The fourth portion RMEd of the first electrode RME1 may be bent from the lower end of the second portion RMEb. The fourth portion RMEd of the first electrode RME1 may connect the second portion RMEb with the fifth portion RMEe. The fourth portion RMEd of the first electrode RME1 may be connected to the first contact electrode CNE1 through a third contact hole CNT3. The fifth portion RME3 of the first electrode RME1 may be bent from the right end of the fourth portion RMEd to be extended in the direction opposite to the second direction (y-axis direction). The fifth portion RMEe of the first electrode RME1 may be disposed on the first sub-bank BNK1*a* disposed on the upper left side. The fifth portion RMEe of the first electrode RME1 may cover the right inclined surface of the first sub-bank BNK1*a* disposed on the upper left side.

The second electrode RME2 may be disposed on the right side of the first electrode RME1. The second electrode RME2 may be extended in the direction opposite to the second direction (y-axis direction) and may cover the left inclined surface of the second sub-bank BNK1*b* having a relatively large width. The second electrode RME2 disposed on the second sub-bank BNK1*b* may face the fifth portion RMEe of the first electrode RME1 disposed on the first sub-bank BNK1*a*. The second electrode RME2 may include a sixth portion RMEf. The sixth portion RMEf of the second electrode RME2 may be connected to the second contact electrode CNE2 through a fourth contact hole CNT4.

The first light-emitting diodes ED1 may be disposed between the first sub-bank BNK1*a* disposed on the upper left side and the second sub-bank BNK1*b* having the relatively large width. The first light-emitting diodes ED1 may be aligned between the first electrode RME1 and the second electrode RME2. Before the upper ends and lower ends of the first and second electrodes RME1 and RME2 may be cut at the cut area CTA and the electrode separation part RMO, each of the first and second electrodes RME1 and RME2 may receive an alignment signal, and an electric field may be formed between the first and second electrodes RME1 and RME2. For example, the first light-emitting diodes ED1 may be ejected onto the first and second electrodes RME1 and RME2 via an inkjet printing process. The first light-emitting diodes ED1 dispersed in the ink may be aligned by receiving a dielectrophoresis force by the electric field formed between the first and second electrodes RME1 and RME2.

A third electrode RME3 may be disposed on the lower left side with respect to the center of the light-emitting area LEA. The third electrode RME3 may be separated from the first electrode RME1 at the electrode separation part RMO. For example, the third electrode RME3 and the second, fourth and fifth portions RMEb, RMEd and RMEe of the first electrode RME1 may have a symmetrical structure with respect to an imaginary line extended in the first direction (x-axis direction). It should be noted that the shape of the third electrode RME3 is not limited thereto. The third electrode RME3 may be disposed on the first sub-bank BNK1*a* disposed on the lower left side. The third electrode RME3 may cover the right inclined surface of the first sub-bank BNK1*a* disposed on the lower left side. The third electrode RME3 may be connected to the second contact electrode CNE2 through a fifth contact hole CNT5.

The fourth electrode RME4 may be disposed on the right side of the third electrode RME3. The fourth electrode RME4 may be separated from the second electrode RME2 at the electrode separation part RMO. The fourth electrode RME4 may be extended in the direction opposite to the second direction (y-axis direction) and may cover the left inclined surface of the second sub-bank BNK1*b* having a relatively large width. The fourth electrode RME4 disposed on the second sub-bank BNK1*b* may face the third electrode RME3 disposed on the first sub-bank BNK1*a*. The fourth electrode RME4 may be connected to the third contact electrode CNE3 through a sixth contact hole CNT6.

The second light-emitting diodes ED2 may be disposed between the first sub-bank BNK1*a* disposed on the lower left side and the second sub-bank BNK1*b* having the relatively large width. The second light-emitting diodes ED2 may be aligned between the third electrode RME3 and the fourth electrode RME4. Before the upper ends of the third and fourth electrodes RME3 and RME4 may be cut at the electrode separation part RMO, each of the third and fourth electrodes RME3 and RME4 may receive an alignment signal, and an electric field may be formed between the third and fourth electrodes RME3 and RME4. For example, the second light-emitting diodes ED2 may be ejected onto the third and fourth electrodes RME3 and RME4 via an inkjet printing process. The second light-emitting diodes ED2 dispersed in the ink may be aligned by receiving a dielectrophoresis force by the electric field formed between the third and fourth electrodes RME3 and RME4.

A fifth electrode RME5 may be disposed on the lower right side with respect to the center of the light-emitting area LEA. The fifth electrode RME5 may be separated from the seventh electrode RME7 at the electrode separation part RMO. The fifth electrode RME5 and the third electrode RME3 may have a symmetrical structure with respect to an imaginary line extended in the second direction (y-axis direction). For example, the fifth electrode RME5 and the seventh electrode RME7 may have a symmetrical structure with respect to an imaginary line extended in the first direction (x-axis direction). It should be noted that the shape of the fifth electrode RME5 is not limited thereto. The fifth electrode RME5 may be disposed on the first sub-bank BNK1*a* disposed on the lower right side. The fifth electrode RME5 may cover the left inclined surface of the first sub-bank BNK1*a* disposed on the lower right side. The fifth electrode RME5 may be connected to the third contact electrode CNE3 through a seventh contact hole CNT7.

The sixth electrode RME6 may be disposed on the left side of the fifth electrode RME5. The sixth electrode RME6 may be separated from the eighth electrode RME8 at the electrode separation part RMO. The sixth electrode RME6 and the fourth electrode RME4 may have a symmetrical structure with respect to an imaginary line extended in the second direction (y-axis direction). It should be noted that the shape of the sixth electrode RME6 is not limited thereto. The sixth electrode RME6 may be extended in the direction opposite to the second direction (y-axis direction) and may cover the right inclined surface of the second sub-bank BNK1*b* having a relatively large width. The sixth electrode RME6 disposed on the second sub-bank BNK1*b* may face the fifth electrode RME5 disposed on the first sub-bank BNK1*a*. The sixth electrode RME6 may be connected to the fourth contact electrode CNE4 through an eighth contact hole CNT8.

The third light-emitting diodes ED3 may be disposed between the first sub-bank BNK1*a* disposed on the lower right side and the second sub-bank BNK1*b* having the relatively large width. The third light-emitting diodes ED3 may be aligned between the fifth electrode RME5 and the sixth electrode RME6. Before the upper ends of the fifth and sixth electrodes RME5 and RME6 may be cut at the electrode separation part RMO, each of the fifth and sixth electrodes RME5 and RME6 may receive an alignment signal, and an electric field may be formed between the fifth and sixth electrodes RME5 and RME6. For example, the third light-emitting diodes ED3 may be ejected onto the fifth and sixth electrodes RME5 and RME6 via an inkjet printing process. The third light-emitting diodes ED3 dispersed in the ink may be aligned by receiving a dielectrophoresis force by the electric field formed between the fifth and sixth electrodes RME5 and RME6.

The seventh electrode RME7 may be disposed on the upper right side with respect to the center of the light-emitting area LEA. The seventh electrode RME7 and the first electrode RME1 may have a symmetrical structure with respect to an imaginary line extended in the second direction (y-axis direction). For example, the seventh electrode RME7 and the fifth electrode RME5 may have a symmetrical structure with respect to an imaginary line extended in the first direction (x-axis direction). It should be noted that the shape of the seventh electrode RME7 is not limited thereto. The seventh electrode RME7 may be disposed on the first sub-bank BNK1a disposed on the upper right side. The seventh electrode RME7 may cover the left inclined surface of the first sub-bank BNK1a disposed on the upper right side. The seventh electrode RME7 may be connected to the fourth contact electrode CNE4 through a ninth contact hole CNT9.

The eighth electrode RME8 may be disposed on the left side of the seventh electrode RME7. The eighth electrode RME8 and the second electrode RME2 may have a symmetrical structure with respect to an imaginary line extended in the second direction (y-axis direction). It should be noted that the shape of the eighth electrode RME8 is not limited thereto. The eighth electrode RME8 may be electrically connected to the second voltage line VSL through a second contact hole CNT2. The eighth electrode RME8 may be extended in the direction opposite to the second direction (y-axis direction) and may cover the right inclined surface of the second sub-bank BNK1b having a relatively large width. The eighth electrode RME8 disposed on the second sub-bank BNK1b may face the seventh electrode RME7 disposed on the first sub-bank BNK1a. The eighth electrode RME8 may be connected to the fifth contact electrode CNE5 through a tenth contact hole CNT10.

The fourth light-emitting diodes ED4 may be disposed between the first sub-bank BNK1a disposed on the upper right side and the second sub-bank BNK1b having the relatively large width. The fourth light-emitting diodes ED4 may be aligned between the seventh electrode RME7 and the eighth electrode RME8. Before the upper ends and lower ends of the seventh and eighth electrodes RME7 and RME8 may be cut at the cut area CTA and the electrode separation part RMO, each of the seventh and eighth electrodes RME7 and RME8 may receive an alignment signal, and an electric field may be formed between the seventh and eighth electrodes RME7 and RME8. For example, the fourth light-emitting diodes ED4 may be ejected onto the seventh and eighth electrodes RME7 and RME8 via an inkjet printing process. The fourth light-emitting diodes ED4 dispersed in the ink may be aligned by receiving a dielectrophoresis force by the electric field formed between the seventh and eighth electrodes RME7 and RME8.

The second bank BNK2 may include a grid pattern extended in the first direction (x-axis direction) and the second direction (y-axis direction). The second bank BNK2 may be disposed at the boundaries between the first to third sub-pixels SP1, SP2 and SP3, thereby distinguishing between adjacent ones of the first to third sub-pixels SP1, SP2 and SP3. The second bank BNK2 may surround the light-emitting area LEA and the cut area CTA of each of the first to third sub-pixels SP1, SP2 and SP3 to distinguish the light-emitting area LEA from the cut area CTA. The second bank BNK2 may be spaced apart from and may surround the light-emitting diodes ED and the first bank BNK1 disposed in the light-emitting area LEA. The width of the light-emitting area LEA in the first direction (x-axis direction) may be smaller than the width of the cut area CTA in the first direction (x-axis direction). It should be understood that the disclosure is not limited thereto.

The electrode insulating portion RPAS may be prepared after the first to eighth electrodes RME1 to RME8 may be cut at the cut area CTA and the electrode separation portion RMO and before the first to fifth contact electrodes CNE1 to CNE5 may be formed. After the first and third electrodes RME1 and RME3 may be cut at the electrode separation part RMO, the electrode insulating portion RPAS may cover the lower end of the first electrode RME1 and the upper end of the third electrode RME3 facing each other. The electrode insulating portion RPAS can prevent a residue of the second contact electrode CNE2 from being connected between the first and third electrodes RME1 and RME3 during the process of forming the second contact electrode CNE2. Accordingly, the electrode insulating portion RPAS can prevent a parasitic current from flowing between the first and third electrodes RME1 and RME3 in case that the pixel SP is driven.

After the second and fourth electrodes RME2 and RME4 may be cut at the electrode separation part RMO, the electrode insulating portion RPAS may cover the lower end of the second electrode RME2 and the upper end of the fourth electrode RME4 facing each other. The electrode insulating portion RPAS can prevent a residue of the second contact electrode CNE2 from being connected between the second and fourth electrodes RME2 and RME4 during the process of forming the second contact electrode CNE2. Accordingly, the electrode insulating portion RPAS can prevent a parasitic current from flowing between the second and fourth electrodes RME2 and RME4 in case that the pixel SP is driven.

After the fifth and seventh electrodes RME5 and RME7 may be cut at the electrode separation part RMO, the electrode insulating portion RPAS may cover the upper end of the fifth electrode RME5 and the lower end of the seventh electrode RME7 facing each other. The electrode insulating portion RPAS can prevent a residue of the fourth contact electrode CNE4 from being connected between the fifth and seventh electrodes RME5 and RME7 during the process of forming the fourth contact electrode CNE4. Accordingly, the electrode insulating portion RPAS can prevent a parasitic current from flowing between the fifth and seventh electrodes RME5 and RME7 in case that the pixel SP is driven.

After the sixth and eighth electrodes RME6 and RME8 may be cut at the electrode separation part RMO, the electrode insulating portion RPAS may cover the upper end of the sixth electrode RME6 and the lower end of the eighth electrode RME8 facing each other. The electrode insulating portion RPAS can prevent a residue of the fourth contact electrode CNE4 from being connected between the sixth and eighth electrodes RME6 and RME8 during the process of forming the fourth contact electrode CNE4. Accordingly, the electrode insulating portion RPAS can prevent a parasitic current from flowing between the sixth and eighth electrodes RME6 and RME8 in case that the pixel SP is driven.

After the first, second, seventh, and eighth electrodes RME1, RME2, RME7 and RME8 may be cut at the cut area CTA, the electrode insulating portion RPAS may cover the cut area CTA. The electrode insulating portion RPAS can prevent a conductive residual film from being connected to the first, second, seventh and eighth electrodes RME1, RME2, RME7 and RME8 during processes after the cut area CTA may be formed. Accordingly, the electrode insulating portion RPAS can prevent a parasitic current from flowing between the first, second, seventh and eighth electrodes RME1, RME2, RME7 and RME8 in case that the pixel SP is driven.

The electrode insulating portion RPAS may be spaced apart from the first to fourth light-emitting diodes ED1 to ED4 when viewed from the top. The electrode insulating portion RPAS may be spaced apart from the first bank BNK1 and the second bank BNK2 when viewed from the top.

As the display device includes the electrode insulating portion RPAS covering the electrode separation part RMO and the cut area CTA, it may be possible to prevent a parasitic current from flowing between the first to eighth electrodes RME1 to RME8. Accordingly, it may be possible to increase the amount of emitted light per unit area of the pixel SP and improve the emission efficiency.

The first contact electrode CNE1 may be disposed on the first electrode RME1. A side of the first contact electrode CNE1 may be connected to the first electrode RME1 through the third contact hole CNT3 disposed on the fourth portion RMEd of the first electrode RME1, and another side of the first contact electrode CNE1 may be disposed on the fifth portion RMEe of the first electrode RME1 and connected to first ends of the first light-emitting diodes ED1. Accordingly, the first contact electrode CNE1 and the first electrode RME1 may correspond to the second node N2 of FIG. 3.

The second contact electrode CNE2 may be extended from above the second electrode RME2 to above the third electrode RME3. One side of the second contact electrode CNE2 may be disposed on the second electrode RME2. A side of the second contact electrode CNE2 may be connected to the second electrode RME2 through the fourth contact hole CNT4, and may be connected to second ends of the first light-emitting diodes ED1. Another side of the second contact electrode CNE2 may be disposed on the third electrode RME3. Another side of the second contact electrode CNE2 may be connected to the third electrode RME3 through the fifth contact hole CNT5, and may be connected to first ends of the second light-emitting diodes ED2. Accordingly, the second contact electrode CNE2 may correspond to the third node N3 of FIG. 3.

The third contact electrode CNE3 may be extended from above the fourth electrode RME4 to above the fifth electrode RME5. A side of the third contact electrode CNE3 may be disposed on the fourth electrode RME4. A side of the third contact electrode CNE3 may be connected to the fourth electrode RME4 through the sixth contact hole CNT6, and may be connected to second ends of the second light-emitting diodes ED2. Another side of the third contact electrode CNE3 may be disposed on the fifth electrode RME5. Another side of the third contact electrode CNE3 may be connected to the fifth electrode RME5 through the seventh contact hole CNT7, and may be connected to first ends of the third light-emitting diodes ED3. Accordingly, the third contact electrode CNE3 may correspond to the fourth node N4 of FIG. 3.

The fourth contact electrode CNE4 may be extended from above the sixth electrode RME6 to above the seventh electrode RME7. A side of the fourth contact electrode CNE4 may be disposed on the sixth electrode RME6. A side of the fourth contact electrode CNE4 may be connected to the sixth electrode RME6 through the eighth contact hole CNT8, and may be connected to second ends of the third light-emitting diodes ED3. Another side of the fourth contact electrode CNE4 may be disposed on the seventh electrode RME7. Another side of the fourth contact electrode CNE4 may be connected to the seventh electrode RME7 through the ninth contact hole CNT9, and may be connected to the first ends of the fourth light-emitting diodes ED4. Accordingly, the fourth contact electrode CNE4 may correspond to the fifth node N5 of FIG. 3.

The fifth contact electrode CNE5 may be disposed on the eighth electrode RME8. A side of the fifth contact electrode CNE5 may be connected to the eighth electrode RME8 through the tenth contact hole CNT10, and another side of the fifth contact electrode CNE5 may be connected to the second ends of the fourth light-emitting diodes ED4. The fifth contact electrode CNE5 may be electrically connected to the second voltage line VSL through the eighth electrode RME8 inserted into the second contact hole CNT2. Accordingly, in connection with FIG. 3, the first to fourth light-emitting diodes ED1, ED2, ED3 and ED4 may be connected in series between the second node N2 and the second voltage line VSL. The display device includes first to eighth electrodes RME1 to RME8 and first to fifth contact electrodes CNE1 to CNE5, so that the first to fourth light-emitting diodes ED1, ED2, ED3 and ED4 may be connected in series. In the display device, as the first to fourth light-emitting diodes ED1, ED2, ED3 and ED4 may be disposed in the light-emitting area LEA, the amount of light per unit area of the pixel SP can be increased and emission efficiency can be improved.

Figure 6:
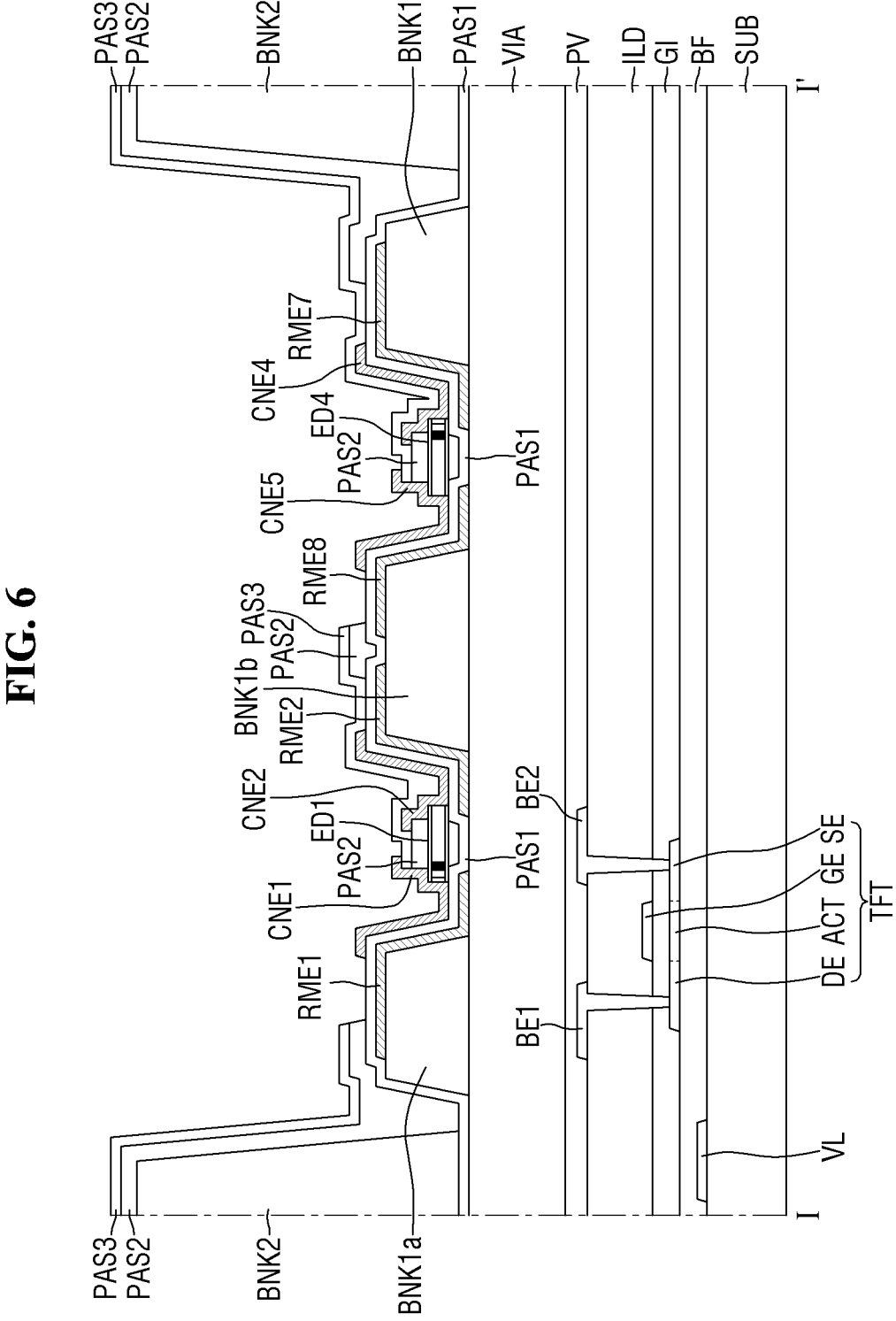
FIG. 6 is a schematic cross-sectional view, taken along line I-I' of FIG. 5.
Figure 7:
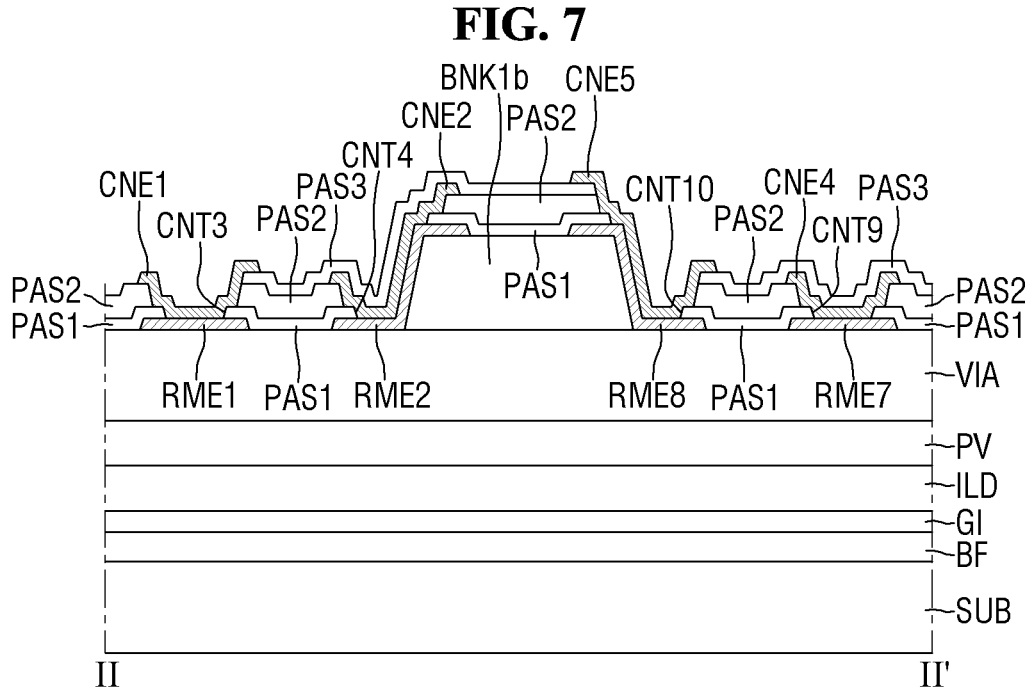
FIG. 7 is a schematic cross-sectional view taken along line II-II' of FIG. 5.

FIG. 6 is a schematic cross-sectional view, taken along line I-I' of FIG. 5. FIG. 7 is a schematic cross-sectional view taken along line II-II' of FIG. 5.

Referring to FIGS. 6 and 7, the display device may include a substrate SUB, a voltage line VL, a buffer layer BF, a thin-film transistor TFT, a gate insulator GI, an interlayer dielectric film ILD, first and second connection electrodes BE1 and BE2, a protection layer PV, a via layer VIA, first and second sub-banks BNK1a and BNK1b, first, second, seventh and eighth electrodes RME1, RME2, RME7 and RME8, first to third insulating layers PAS1, PAS2 and PAS3, a second bank BNK2, first and fourth light-emitting diodes ED1 and ED4, first, second, fourth and fifth contact electrodes CNE1, CNE2, CNE4 and CNE5.

The substrate SUB may be a base substrate or a base member and may include an insulating material. The substrate SUB may be a flexible substrate that can be bent, folded, or rolled. For example, the substrate SUB may include, but is not limited to, a glass material, a metal material, or a combination thereof. As another example, the substrate SUB may include a polymer resin such as polyimide PI.

The voltage line VL may be disposed on the substrate SUB. For example, the voltage line VL may be one of the first voltage line VDL, the second voltage line VSL and the initialization voltage line VIL shown in FIG. 3. The voltage line VL may be made up of a single layer or multiple layers of at least one of molybdenum (Mo), aluminum (Al), chromium (Cr), gold (Au), titanium (Ti), nickel (Ni), neodymium (Nd), and copper (Cu), or an alloy thereof.

The buffer layer BF may cover the voltage line VL and the substrate SUB. The buffer layer BF may include an inorganic material that can prevent the permeation of air or moisture. For example, the buffer layer BF may include inorganic films stacked on one another alternately.

The thin-film transistor TFT may be disposed on the buffer layer BF, and may form a pixel circuit of each of multiple pixels SP. For example, the thin-film transistor TFT may be one of the first to third transistors ST1, ST2 and ST3 shown in FIG. 3. The thin-film transistor TFT may include a semiconductor region ACT, a gate electrode GE, a source electrode SE, and a drain electrode DE.

The semiconductor region ACT, the source electrode SE and the drain electrode DE may be disposed on the buffer layer BF. The semiconductor region ACT may overlap the gate electrode GE in the thickness direction and may be insulated from the gate electrode GE by the gate insulator GI. The source electrode SE and the drain electrode DE may be formed by converting the material of the semiconductor region ACT into a conductor.

The gate electrode GE may be disposed on the gate insulator GI. The gate electrode GE may be a part of the gate line GL or a part of the auxiliary gate line BGL extended from the gate line GL. The gate electrode GE may overlap the semiconductor region ACT with the gate insulator GI interposed therebetween.

The gate insulator GI may be disposed on the semiconductor region ACT, the source electrode SE and the drain electrode DE. For example, the gate insulator GI may cover the semiconductor region ACT, the source electrode SE, the drain electrode DE and the buffer layer BF1, and may insulate the semiconductor region ACT from the gate electrode GE. The gate insulator GI may include contact holes through which the first and second connection electrodes BE1 and BE2 pass, respectively.

The interlayer dielectric film ILD may cover the gate electrode GE and the gate insulator GI. The interlayer dielectric film ILD may include contact holes through which the first and second connection electrodes BE1 and BE2 pass, respectively. The contact hole of the interlayer dielectric film may be connected to the contact hole of the gate insulator GI.

The first and second connection electrodes BE1 and BE2 may be disposed on the interlayer dielectric film ILD. The first connection electrode BE1 may be connected to the drain electrode DE of the thin-film transistor TFT through a contact hole formed in the interlayer dielectric film ILD and the gate insulator GI. The second connection electrode BE2 may be connected to the source electrode SE of the thin-film transistor TFT through a contact hole formed in the interlayer dielectric film ILD and the gate insulator GI. For example, the second connection electrode BE2 may be electrically connected to the first electrode RME1 through the first contact hole CNT1 shown in FIG. 5, but the disclosure is not limited thereto.

The protection layer PV may cover the first and second connection electrodes BE1 and BE2 and the interlayer dielectric film ILD. The protection layer PV can protect the thin-film transistor TFT.

The via layer VIA may be disposed on the protection layer PV to provide a flat surface over the thin-film transistor TFT. For example, the via layer VIA may include an organic insulating material such as polyimide PI.

The first and second sub-banks BNK1a and BNK1b may be disposed on the via layer VIA. The first and second sub-banks BNK1a and BNK1b may protrude from the upper surface of the via layer VIA. The first and second sub-banks BNK1a and BNK1b may be disposed in the light-emitting area LEA of each of the pixels SP. The first light-emitting diodes ED1 may be disposed between the first sub-bank BNK1a on the left side and the second sub-bank BNK1b. The fourth light-emitting diodes ED4 may be disposed between the first sub-bank BNK1a on the right side and the second sub-bank BNK1b. The first and second sub-banks BNK1a and BNK1b may have inclined sides. The light emitted from the first and fourth light-emitting diodes ED1 and ED4 may be reflected by the first, second, seventh and eighth electrodes RME1, RME2, RME7 and RME8 disposed on the first and second sub-banks BNK1a and BNK1b. For example, the first and second sub-banks BNK1a and BNK1b may include an organic insulating material such as polyimide (PI).

The first, second, seventh and eighth electrodes RME1, RME2, RME7 and RME8 may be disposed on the via layer VIA and the first and second sub-banks BNK1a and BNK1b. The first electrode RME1 may be disposed on the right inclined surface of the first sub-bank BNK1a on the left side, and the second electrode RME2 may be disposed on the left inclined surface of the second sub-bank BNK1b. The seventh electrode RME7 may be disposed on the left inclined surface of the first sub-bank BNK1a on the right side, and the eighth electrode RME8 may be disposed on the right inclined surface of the second sub-bank BNK1b. The first and second electrodes RME1 and RME2 may be disposed on the inclined surfaces of the first and second sub-banks BNK1a and BNK1b to reflect lights emitted from the first light-emitting diodes ED1. The seventh and eighth electrodes RME7 and RME8 may be disposed on the inclined surfaces of the first and second sub-banks BNK1a and BNK1b to reflect lights emitted from the fourth light-emitting diodes ED4.

The first, second, seventh and eighth electrodes RME1, RME2, RME7 and RME8 may include a conductive material having high reflectance. For example, the first, second, seventh and eighth electrodes RME1, RME2, RME7 and RME8 may include at least one of silver (Ag), copper (Cu), aluminum (Al), nickel (Ni), and lanthanum (La). As another example, the first, second, seventh and eighth electrodes RME1, RME2, RME7 and RME8 may include a material such as ITO, IZO, ITZO, or a combination thereof. As another example, the first, second, seventh and eighth electrodes RME1, RME2, RME7 and RME8 may include layers having a transparent conductive material layer and a highly reflective metal layer, or may include a single layer including a transparent conductive material and a highly reflective metal. The first, second, seventh and eighth electrodes RME1, RME2, RME7 and RME8 may have a stack structure such as ITO/Ag/ITO/, ITO/Ag/IZO, and ITO/Ag/ITZO/IZO.

The first insulating layer PAS1 may be disposed on the via layer PAS and the first, second, seventh and eighth electrodes RME1, RME2, RME7 and RME8. The first insulating layer PAS1 can protect and insulate the first, second, seventh and eighth electrodes RME1, RME2, RME7 and RME8 from one another. The first insulating layer PAS1 can prevent the first and fourth light-emitting diodes ED1 and ED4 from being brought into contact with the first, second, seventh and eighth electrodes RME1, RME2, RME7 and RME8 during the process of aligning the first and fourth light-emitting diodes ED1 and ED4, thereby preventing damage to them.

The second bank layer BNK2 may be disposed on the first insulating layer PAS1. The second bank BNK2 may be disposed at the boundary of each of the pixels SP to distinguish the light-emitting diodes ED of a pixel SP from those of another one. The second bank BNK2 may have a height and may include an organic insulating material such as polyimide PI.

The first and fourth light-emitting diodes ED1 and ED4 may be disposed on the first insulating layer PAS1. The first light-emitting diodes ED1 may be aligned in parallel with one another between the first and second electrodes RME1 and RME2. The first light-emitting diodes ED1 may be longer than the distance between the first and second electrodes RME1 and RME2. The first light-emitting diodes ED1 may include semiconductor layers. An end and another end opposite thereto may be defined with respect to a semiconductor layer. First ends of the first light-emitting diodes ED1 may be disposed on the first electrode RME1, and second ends of the first light-emitting diodes ED1 may be disposed on the second electrode RME2. The first ends of the first light-emitting diodes ED1 may be connected to the first contact electrode CNE1, and the second ends of the first light-emitting diodes ED1 may be connected to the second contact electrode CNE2. The fourth light-emitting diodes ED4 may be aligned in parallel with one another between the seventh and eighth electrodes RME7 and RME8.

The second insulating layer PAS2 may be disposed on the first and fourth light-emitting diodes ED1 and ED4. For example, the second insulating layer PAS2 may partially cover the first and fourth light-emitting diodes ED1 and ED4, leaving the ends of each of the first and fourth light-emitting diodes ED1 and ED4. The second insulating layer PAS2 can protect the first and fourth light-emitting diodes ED1 and ED4, and can fix the first and fourth light-emitting diodes ED1 and ED4 during the process of fabricating the display device. The space between each of the first and fourth light-emitting diodes ED1 and ED4 and the first insulating layer PAS1 can be filled with the second insulating layer PAS2.

The second insulating layer PAS2 may also be disposed on the first and second sub-banks BNK1a and BNK1b and the second bank BNK2. The second insulating layer PAS2 may be disposed on the first insulating layer PAS1, the ends of the first and fourth light-emitting diodes ED1 and ED4, and parts of the first, second, seventh and eighth electrodes RME1, RME2, RME7 and RME8 may not be covered by the second insulating layer PAS2.

The first contact electrode CNE1 may be disposed on the first insulating layer PAS1. A side of the first contact electrode CNE1 may be connected to the first electrode RME1 through the third contact hole CNT3, and another side of the first contact electrode CNE1 may be connected to the first ends of the first light-emitting diodes ED1.

The second contact electrode CNE2 may be disposed on the first insulating layer PAS1. The second contact electrode CNE2 may be connected to the second electrode RME2 through the fourth contact hole CNT4, and may be connected to the second ends of the first light-emitting diodes ED1.

The fourth contact electrode CNE4 may be disposed on the first insulating layer PAS1. The fourth contact electrode CNE4 may be connected to the seventh electrode RME7 through the ninth contact hole CNT9, and may be connected to the second ends of the fourth light-emitting diodes ED4.

The fifth contact electrode CNE5 may be disposed on the first insulating layer PAS1, and may be connected to the eighth electrode RME8 through the tenth contact hole CNT10. The fifth contact electrode CNE5 may be electrically connected to the second voltage line VSL through the eighth electrode RME8.

The third insulating layer PAS3 may be disposed on the second insulating layer PAS2. The third insulating layer PAS3 may cover the second and fourth contact electrodes CNE2 and CNE4. The third insulating layer PAS3 may insulate the first contact electrode CNE1 from the second contact electrode CNE2 on the first light-emitting diodes ED1, and may insulate the fourth contact electrode CNE4 from the fifth contact electrode CNE5 on the fourth light-emitting diodes ED4.

Figure 8:
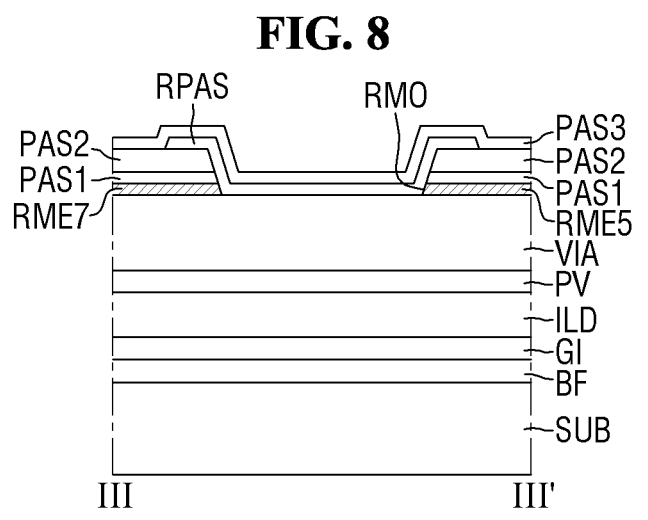

FIG. 8 is a schematic cross-sectional view, taken along line III-III' of FIG. 5. In the following description, the same elements as those described above will be briefly described or omitted.

Referring to FIG. 8, the electrode insulating portion RPAS may be prepared after the seventh and eighth electrodes RME7 and RME8 may be cut at the electrode separation portion RMO and before the fourth contact electrode CNE4 may be formed. After the seventh and eighth electrodes RME7 and RME8 may be cut at the electrode separation part RMO, the electrode insulating portion RPAS may cover the via layer VIA exposed at the electrode separation part RMO. The electrode insulating portion RPAS may cover one end of the seventh electrode RME7, one end of the first insulating layer PAS1 and one end of the second insulating layer PAS2 formed at the electrode separation part RMO. The electrode insulating portion RPAS may cover an end of the eighth electrode RME8 facing the end of the seventh electrode RME7, another end of the first insulating layer PAS1 and another end of the second insulating layer PAS2 formed at the electrode separation part RMO. The electrode insulating portion RPAS can prevent a residue of the fourth contact electrode CNE4 from being connected between the seventh and eighth electrodes RME7 and RME8 during the process of forming the fourth contact electrode CNE4. Accordingly, the electrode insulating portion RPAS can prevent a parasitic current from flowing between the seventh and eighth electrodes RME7 and RME8 in case that the pixel SP is driven. The third insulating layer PAS3 may cover the electrode insulating portion RPAS and the second insulating layer PAS2.

FIGS. 9 to 14 are schematic plan views showing processing steps of fabricating a display device according to an embodiment of the disclosure.

Figure 9:
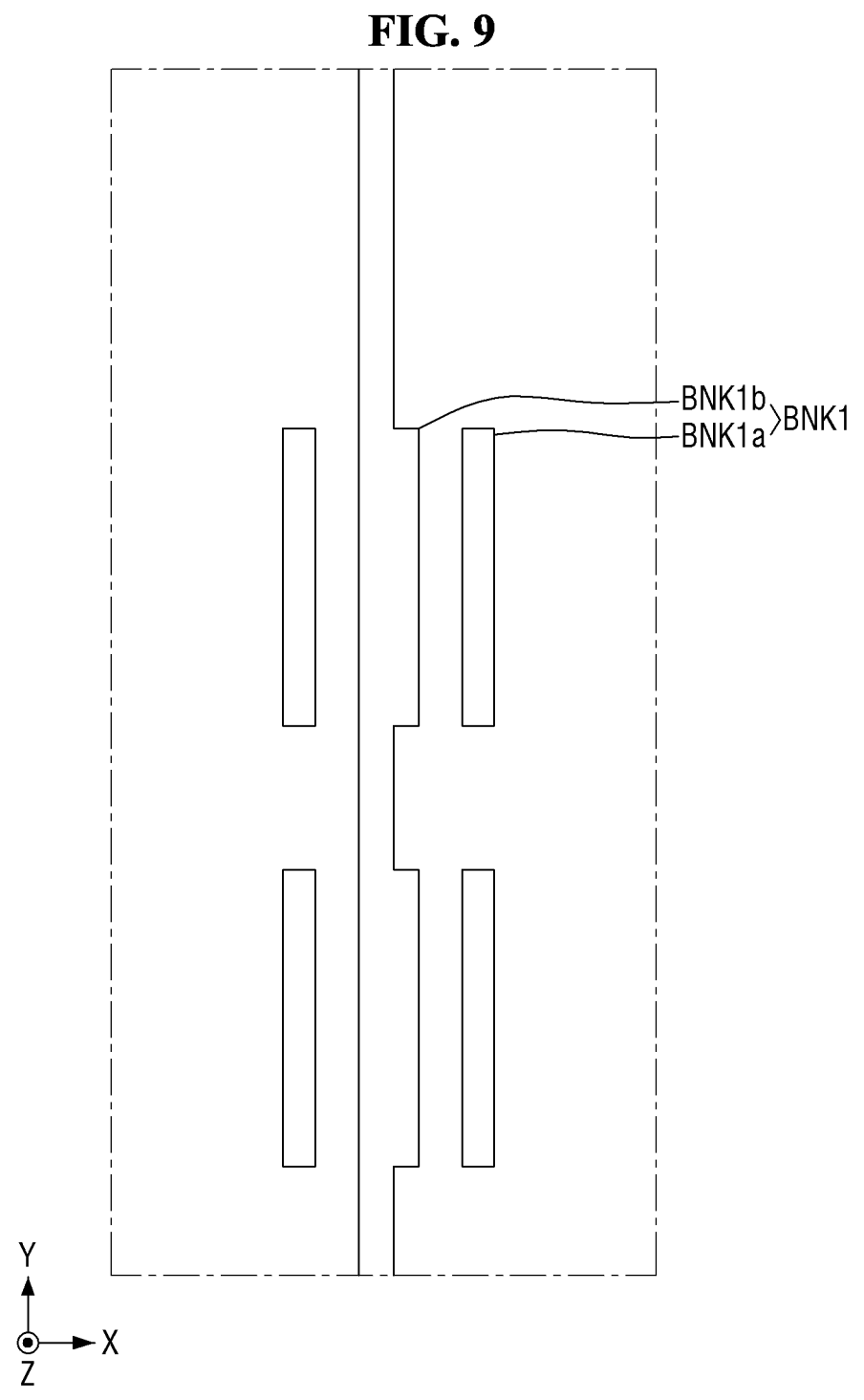

In FIG. 9, the first bank BNK1 may include first sub-banks BNK1a and a second sub-bank BNK1b. The first sub-banks BNK1a may be extended in the second direction (y-axis direction) on both sides of the second sub-bank BNK1b. The first sub-banks BNK1a may be spaced apart from one another in the first direction (x-axis direction) and the second direction (y-axis direction). The first sub-banks BNK1a may be disposed in the four areas, respectively, divided by lines intersecting the center of the light-emitting area LEA in the first direction (x-axis direction) and the second direction (y-axis direction).

The second sub-bank BNK1b may pass through the central portion of the light-emitting area LEA and may be extended in the second direction (y-axis direction). The second sub-bank BNK1b may be disposed between the first sub-banks BNK1a spaced apart from one another in the first direction (x-axis direction). Parts of the second sub-bank BNK1b disposed between the first sub-banks BNK1a may have a larger width.

Figure 10:
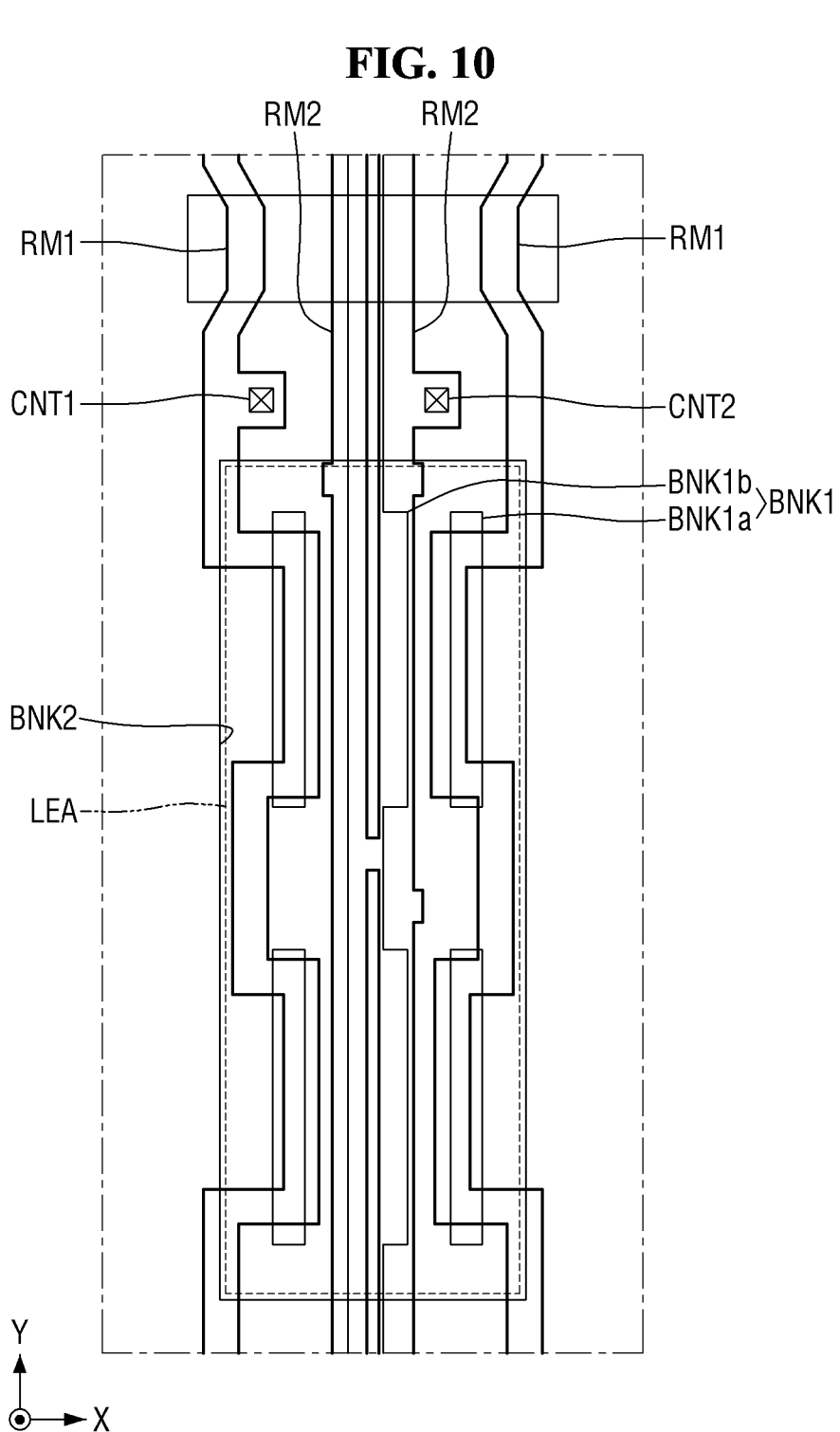

In FIG. 10, first and second alignment electrodes RM1 and RM2 may be extended in the second direction (the y-axis direction). Two first alignment electrodes RM1 may be disposed on the left and right sides of the light-emitting area LEA, respectively, and may be disposed on the first sub-banks BNK1a. The first alignment electrode RM1 on the left side may be disposed on the right inclined surfaces of the first sub-banks BNK1a on the left side, and the first alignment electrode RM1 on the right side may be disposed on the left inclined surfaces of the first sub-banks BNK1a on the right side. The first alignment electrode RM1 may be connected to the pixel circuit of the pixel SP through the first contact hole CNT1.

Two second alignment electrodes RM2 may be disposed at the center of the light-emitting area LEA and may be connected to each other. The second alignment electrode RM2 on the left side may be disposed on the left inclined surface of the second sub-bank BNK1b, and the second alignment electrode RM2 on the right side may be disposed on the right inclined surface of the second sub bank BNK1b.

The second bank BNK2 may include a grid pattern extended in the first direction (x-axis direction) and the second direction (y-axis direction). The second bank BNK2 may be disposed at the boundaries between the first to third sub-pixels SP1, SP2 and SP3, thereby distinguishing adjacent ones of the first to third sub-pixels SP1, SP2 and SP3. The second bank BNK2 may surround the light-emitting area LEA and the cut area CTA of each of the first to third sub-pixels SP1, SP2 and SP3 to distinguish the light-emitting area LEA from the cut area CTA. The width of the light-emitting area LEA in the first direction (x-axis direction) may be smaller than the width of the cut area CTA in the first direction (x-axis direction). It should be understood that the disclosure is not limited thereto.

Figure 11:
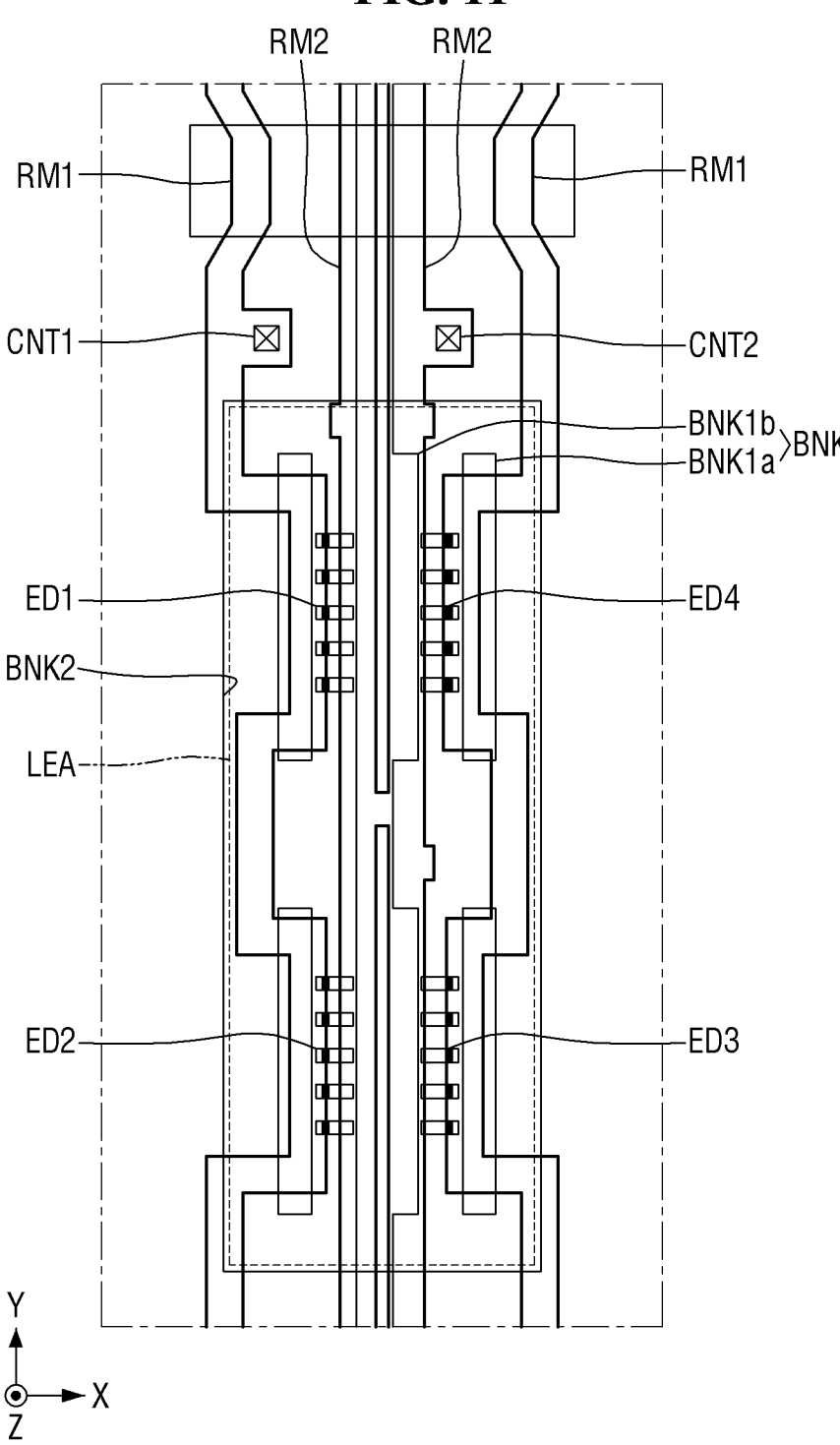

In FIG. 11, the first and second light-emitting diodes ED1 and ED2 may be aligned between the first alignment electrode RM1 and the second alignment electrode RM2 on the left side. The first and second alignment electrodes RM1 and RM2 may receive an alignment signal, and an electric field may be formed between the first and second alignment electrodes RM1 and RM2. For example, the first and second light-emitting diodes ED1 and ED2 may be ejected onto the first and second alignment electrodes RM1 and RM2 via an inkjet printing process. The first and second light-emitting diodes ED1 and ED2 dispersed in the ink may be aligned by receiving a dielectrophoresis force by the electric field formed between the first and second alignment electrodes RM1 and RM2.

The third and fourth light-emitting diodes ED3 and ED4 may be aligned between the first alignment electrode RM1 and the second alignment electrode RM2 on the right side. The first and second alignment electrodes RM1 and RM2 may receive an alignment signal, and an electric field may be formed between the first and second alignment electrodes RM1 and RM2. For example, the third and fourth light-emitting diodes ED3 and ED4 may be ejected onto the first and second alignment electrodes RM1 and RM2 via an inkjet printing process. The third and fourth light-emitting diodes ED3 and ED4 dispersed in the ink may be aligned by receiving a dielectrophoresis force by the electric field formed between the first and second alignment electrodes RM1 and RM2.

Figure 12:
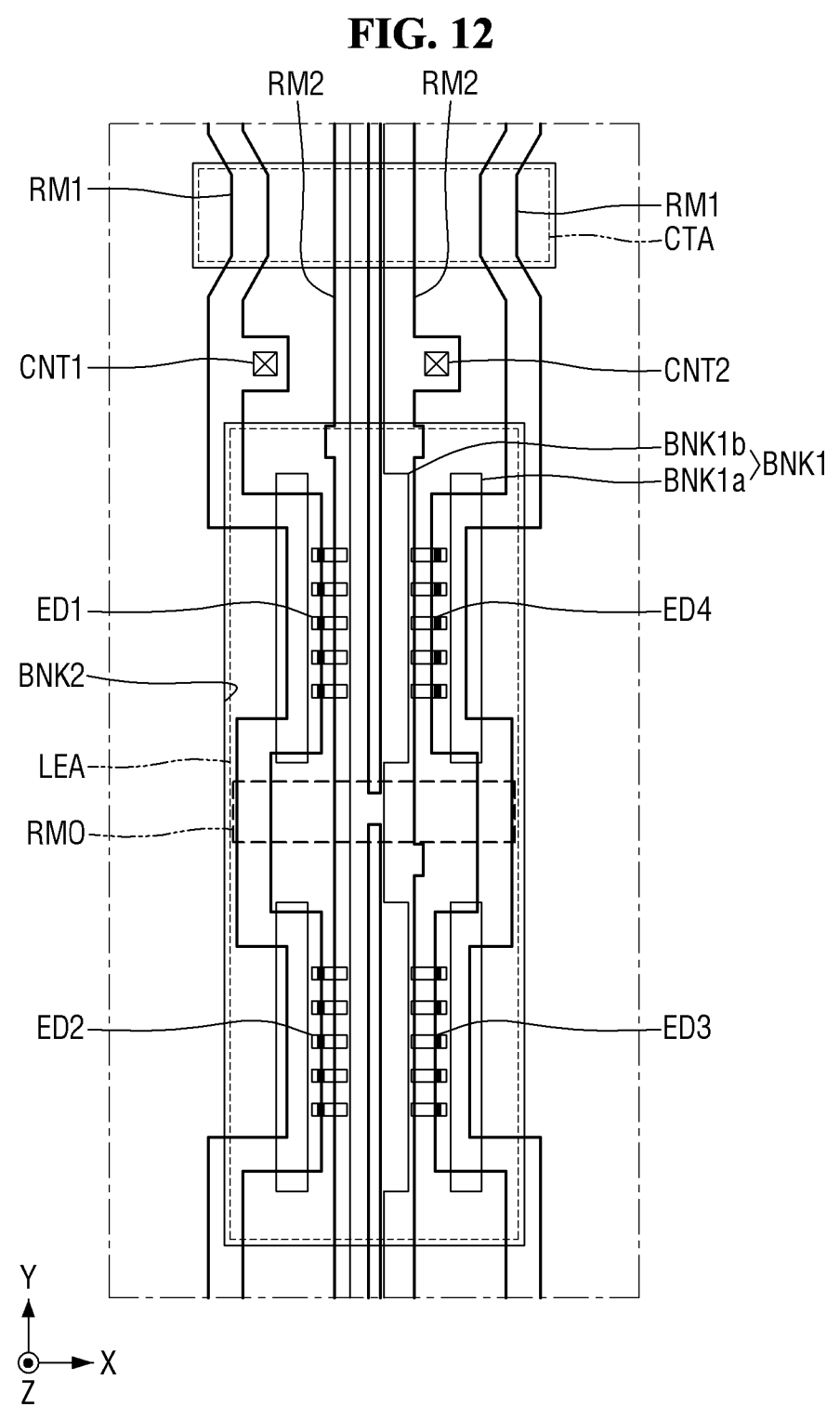
Figure 13:
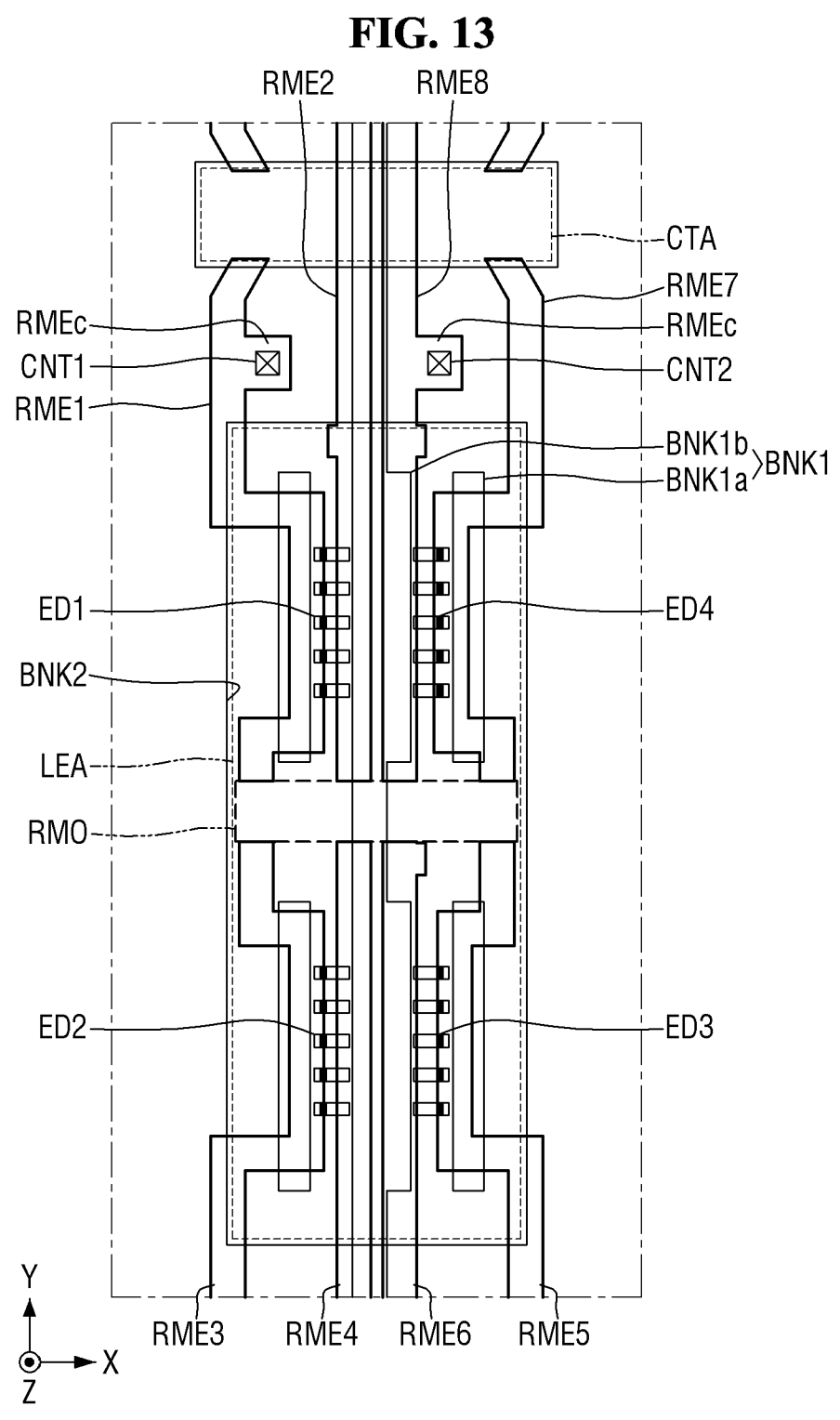

Referring to FIGS. 12 and 13 in conjunction with FIG. 8, the first and second insulating layers PAS1 and PAS2 may be patterned so that they conform to the electrode separation part RMO. For example, the first and second insulating layers PAS1 and PAS2 may be patterned via a dry etching process.

The first and second alignment electrodes RM1 and RM2 may be cut at the cut area CTA and the electrode separation part RMO. The first and second alignment electrodes RM1 and RM2 may be cut at cut area CTA and the electrode separation part RMO via a wet etching process. For example, a wet etching process may be carried out at the cut area CTA and the electrode separation part RMO using a mask different from the mask used for the dry etching process of the first and second insulating layers PAS1 and PAS2. For another example, a wet etching process may be carried out at the cut area CTA and the electrode separation part RMO using the mask used for the dry etching process of the first and second insulating layers PAS1 and PAS2. In this instance, the cut area CTA, the electrode separation part RMO, and the first and second insulating layers PAS1 and PAS2 may be formed via a same etching process.

The left first alignment electrode RM1 may be separated from the first alignment electrode of the sub-pixel disposed on the upper side at the cut area CTA. The left first alignment electrode RM1 may be separated into first and third electrodes RME1 and RME3 by the electrode separation part RMO.

The left second alignment electrode RM2 may be separated from the second alignment electrode of the sub-pixel disposed on the upper side at the cut area CTA. The left second alignment electrode RM2 may be separated into second and fourth electrodes RME2 and RME4 by the electrode separation part RMO.

The right first alignment electrode RM1 may be separated from the first alignment electrode of the sub-pixel disposed on the upper side at the cut area CTA. The right first alignment electrode RM1 may be separated into fifth and third seventh RME5 and RME7 by the electrode separation part RMO.

The right second alignment electrode RM2 may be separated from the second alignment electrode of the sub-pixel disposed on the upper side at the cut area CTA. The right second alignment electrode RM2 may be separated into sixth and eighth electrodes RME6 and RME8 by the electrode separation part RMO.

Figure 14:
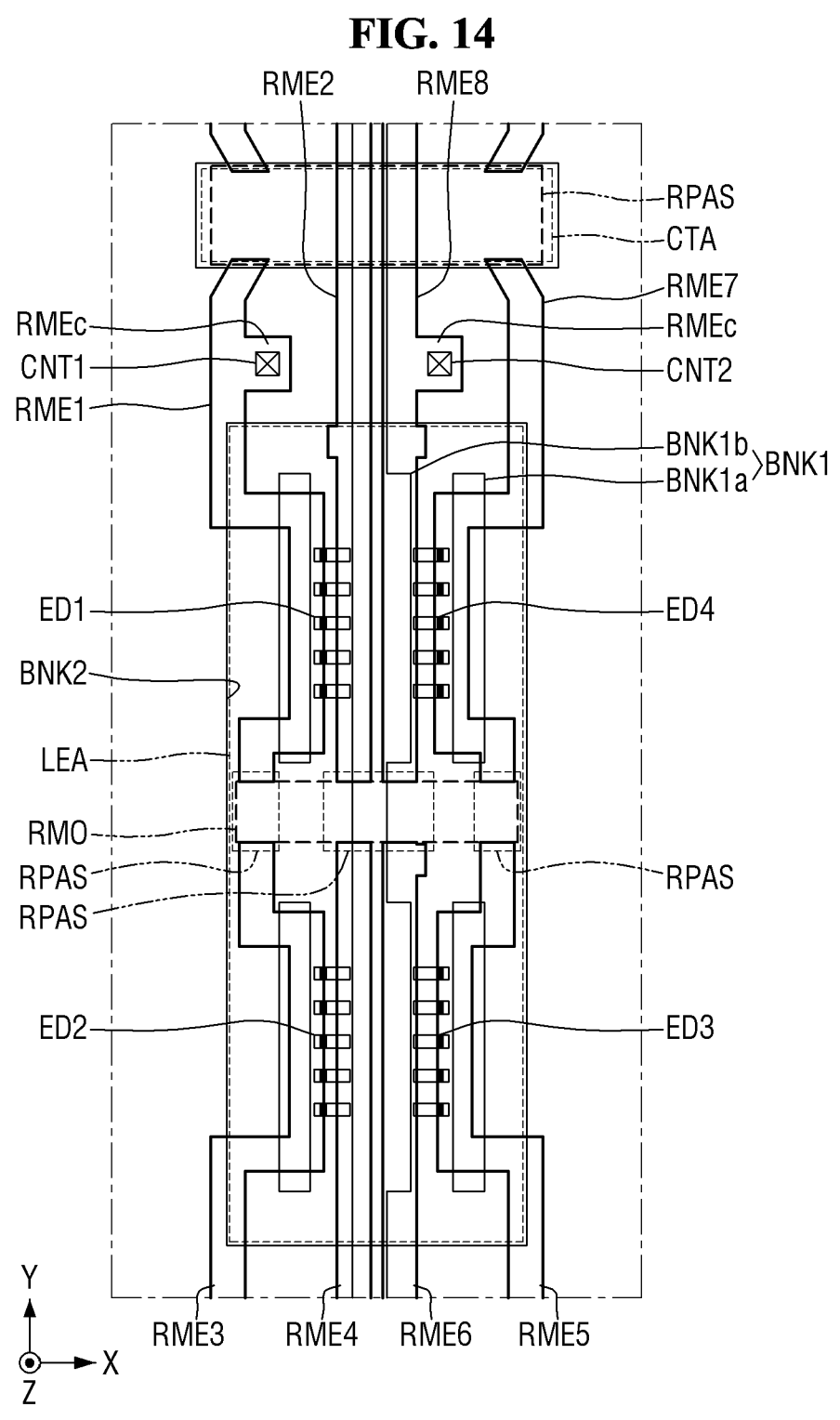

In the example shown in FIG. 14, the electrode insulating portion RPAS may be prepared after the first to eighth electrodes RME1 to RME8 may be cut at the cut area CTA and the electrode separation portion RMO and before the first to fifth contact electrodes CNE1 to CNE5 may be formed. After the first and third electrodes RME1 and RME3 may be cut at the electrode separation part RMO, the electrode insulating portion RPAS may cover the lower end of the first electrode RME1 and the upper end of the third electrode RME3 facing each other. The electrode insulating portion RPAS can prevent a residue of the second contact electrode CNE2 from being connected between the first and third electrodes RME1 and RME3 during the process of forming the second contact electrode CNE2. Accordingly, the electrode insulating portion RPAS can prevent a parasitic current from flowing between the first and third electrodes RME1 and RME3 in case that the pixel SP is driven.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims including equivalents thereof.

What is claimed is:

1. A display device comprising:
   a first electrode extending in a first direction on a substrate;
   a second electrode disposed parallel to the first electrode on the substrate;
   a third electrode separated from the first electrode by an electrode separation part on the substrate;

a first insulating layer on the first electrode, the second electrode, and the third electrode, the first insulating layer being patterned to correspond to the electrode separation part;

a first light-emitting element between the first electrode and the second electrode on the first insulating layer;

a second insulating layer on a part of the first light-emitting element and the first insulating layer, the second insulating layer being patterned to correspond to the electrode separation part;

an electrode insulating portion overlapping an end of each of the first electrode and the third electrode facing each other separated by the electrode separation part; and a third insulating layer overlapping the second insulating layer and the electrode insulating portion.

2. The display device of claim 1, wherein the electrode insulating portion overlaps ends of the first insulating layer patterned to correspond to the electrode separation part.

3. The display device of claim 1, wherein the electrode insulating portion overlaps ends of the second insulating layer patterned to correspond to the electrode separation part.

4. The display device of claim 1, wherein the electrode insulating portion is spaced apart from the first light-emitting element.

5. The display device of claim 1, further comprising:

a thin-film transistor on the substrate; and a via layer that provides a flat surface over the thin-film transistor and supports the first electrode, the second electrode, and the third electrode, wherein the electrode insulating portion directly overlaps an upper surface of the via layer exposed at the electrode separation part.

6. The display device of claim 5, further comprising:

a first bank protruding from the upper surface of the via layer to support the first electrode, the second electrode, and the third electrode, wherein the electrode insulating portion is spaced apart from the first bank.

7. The display device of claim 6, further comprising:

a second bank disposed on the first insulating layer and spaced apart from and surrounding the first light-emitting element and the first bank, wherein the electrode insulating portion is spaced apart from the second bank.

8. The display device of claim 1, further comprising:

a first contact electrode electrically connecting a first end of the first light-emitting element with the first electrode; and a second contact electrode electrically connecting a second end of the first light-emitting element with the second electrode, wherein the first contact electrode and the second contact electrode are insulated from the first electrode, the second electrode, and the third electrode by the electrode insulating portion.

9. The display device of claim 1, wherein the third insulating layer overlaps an end of the electrode insulating portion on the first electrode, and the third insulating layer overlaps another end of the electrode insulating portion on the second electrode.

10. The display device of claim 1, further comprising:

a fourth electrode separated from the second electrode by the electrode separation part on the substrate, wherein the electrode insulating portion overlaps an end of each of the second electrode and the fourth electrode facing each other at the electrode separation part.

11. The display device of claim 10, further comprising:

a second light-emitting element between the third electrode and the fourth electrode on the first insulating layer;

a second contact electrode electrically connecting a second end of the first light-emitting element with the second electrode; and a third contact electrode disposed in parallel with a part of the second contact electrode, wherein the second contact electrode extends from above the second electrode to above the third electrode to electrically connect a first end of the second light-emitting element with the third electrode, and the third contact electrode electrically connects a second end of the second light-emitting element with the fourth electrode.

12. The display device of claim 11, wherein the electrode insulating portion is spaced apart from the second light-emitting element.

* * * * *